(12) United States Patent
Henningsen et al.

(10) Patent No.: US 11,901,679 B2
(45) Date of Patent: Feb. 13, 2024

(54) HARDLINE SPLITTER WITH DIRECT CONNECTION

(71) Applicant: PPC BROADBAND, INC., East Syracuse, NY (US)

(72) Inventors: Jimmy Ciesla Henningsen, Holmegaard (DK); Michael Ole Matzen, Vordingborg (DK)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 18/073,784

(22) Filed: Dec. 2, 2022

(65) Prior Publication Data

US 2023/0102781 A1    Mar. 30, 2023

Related U.S. Application Data

(63) Continuation of application No. 16/635,890, filed as application No. PCT/US2018/043865 on Jul. 26, 2018, now Pat. No. 11,539,176.

(60) Provisional application No. 62/539,070, filed on Jul. 31, 2017.

(51) Int. Cl.
  *H01R 24/54*    (2011.01)
  *H01R 31/00*    (2006.01)
  *H05K 1/14*     (2006.01)

(52) U.S. Cl.
  CPC ......... *H01R 24/547* (2013.01); *H01R 31/005* (2013.01); *H05K 1/147* (2013.01)

(58) Field of Classification Search
  CPC ..... H01R 24/547; H01R 31/005; H05K 1/147
  USPC ....................................................... 174/250
  See application file for complete search history.

(56) References Cited

U.S. PATENT DOCUMENTS

| | | |
|---|---|---|
| 3,091,743 A | 5/1963 | Wilkinson |
| 3,537,036 A | 10/1970 | Wineguard et al. |
| 3,641,464 A | 2/1972 | Crowhurst et al. |
| 3,676,744 A | 7/1972 | Pennypacker |
| 3,757,276 A | 9/1973 | Kailus |
| 3,760,130 A | 9/1973 | Ross et al. |
| D264,710 S | 6/1982 | Shu |

(Continued)

FOREIGN PATENT DOCUMENTS

FR          96276 E        6/1972

OTHER PUBLICATIONS

International Search Report and Written Opinion of the International Searching Authority; PCT/US2018/043865; dated Oct. 9, 2018; 13 Pages; European Patent Office.

(Continued)

*Primary Examiner* — Andargie M Aychillhum
(74) *Attorney, Agent, or Firm* — MH2 TECHNOLOGY LAW GROUP LLP

(57) ABSTRACT

A splitter for allowing a hardline cable to be connected to the spotter as an input and a connector to be connected to the splitter as an output includes a housing portion. The housing portion includes an input portion; the input portion is configured to receive a hardline input cable; the housing portion includes an output portion; the input portion includes an engagement portion configured to engage a hardline back nut; the sputter is configured to connect to the hardline input cable; and the connection of the splitter to the hardline input cable is configured to allow the splitter to be installed on the hardline input cable without additional hardware to connect the splitter to the hardline input cable.

23 Claims, 21 Drawing Sheets

(56) References Cited

U.S. PATENT DOCUMENTS

| | | |
|---|---|---|
| 4,370,516 A | 1/1983 | Bailey, Jr. et al. |
| 4,459,568 A | 7/1984 | Landt |
| 4,755,776 A | 7/1988 | Preschutti |
| 5,347,245 A | 9/1994 | Wright, Jr. |
| 5,909,154 A | 6/1999 | Brown et al. |
| 6,168,465 B1 | 1/2001 | Hirota |
| 6,261,125 B1 | 7/2001 | Yeh |
| 7,138,886 B2 | 11/2006 | Strull et al. |
| 7,830,225 B2 | 11/2010 | Gale |
| 8,752,114 B1 | 6/2014 | Shapson et al. |
| 9,147,963 B2 | 9/2015 | Balcer et al. |
| 2004/0246686 A1 | 12/2004 | Rohm et al. |
| 2006/0279379 A1 | 12/2006 | Gale |
| 2008/0018413 A1 | 1/2008 | Strull et al. |
| 2011/0028035 A1* | 2/2011 | McAllister ........... H01R 13/748 439/579 |
| 2013/0111539 A1* | 5/2013 | Egan ...................... H04N 7/106 725/151 |
| 2013/0157507 A1 | 6/2013 | Riggsby et al. |
| 2014/0224516 A1 | 8/2014 | Wang |
| 2015/0064946 A1 | 3/2015 | Darrow et al. |
| 2016/0202429 A1 | 7/2016 | Korczak |

OTHER PUBLICATIONS

Show EM Cables; "8-WAY Coax Splitter—5 to 1000 MHZ"; 3 Pages (2020) https://www.showmecables.com/8-way-ultra-splitter-bandwidth-5-1000-mhz?gclid=CJ-T1u3r1tMCFc9MDQod1H8OMg.

Tselectronic; "Signal Splitters for Digital Television and HDTV"; 3 Pages; (2005)https://www.tselectronic.com/tech_notes/digital_splitters.php.

* cited by examiner

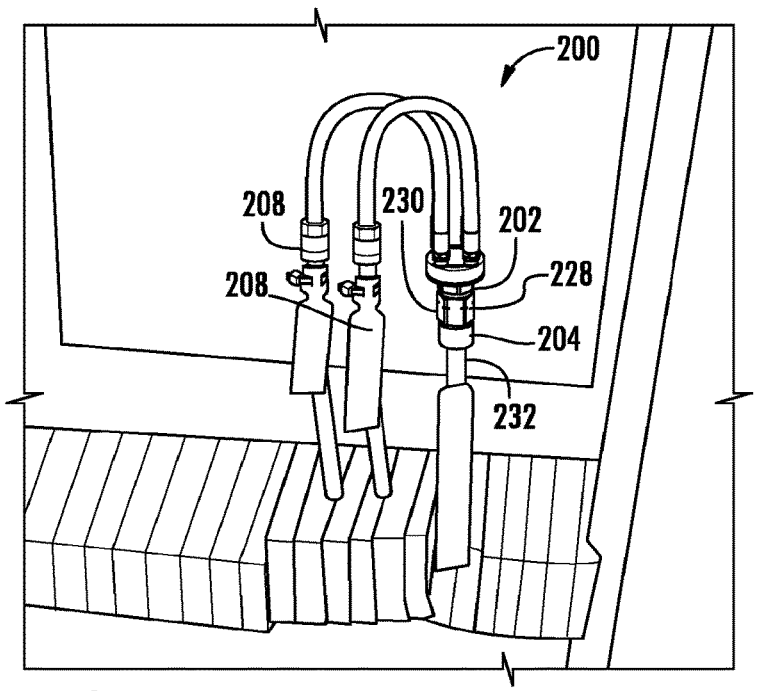
FIG. 2A
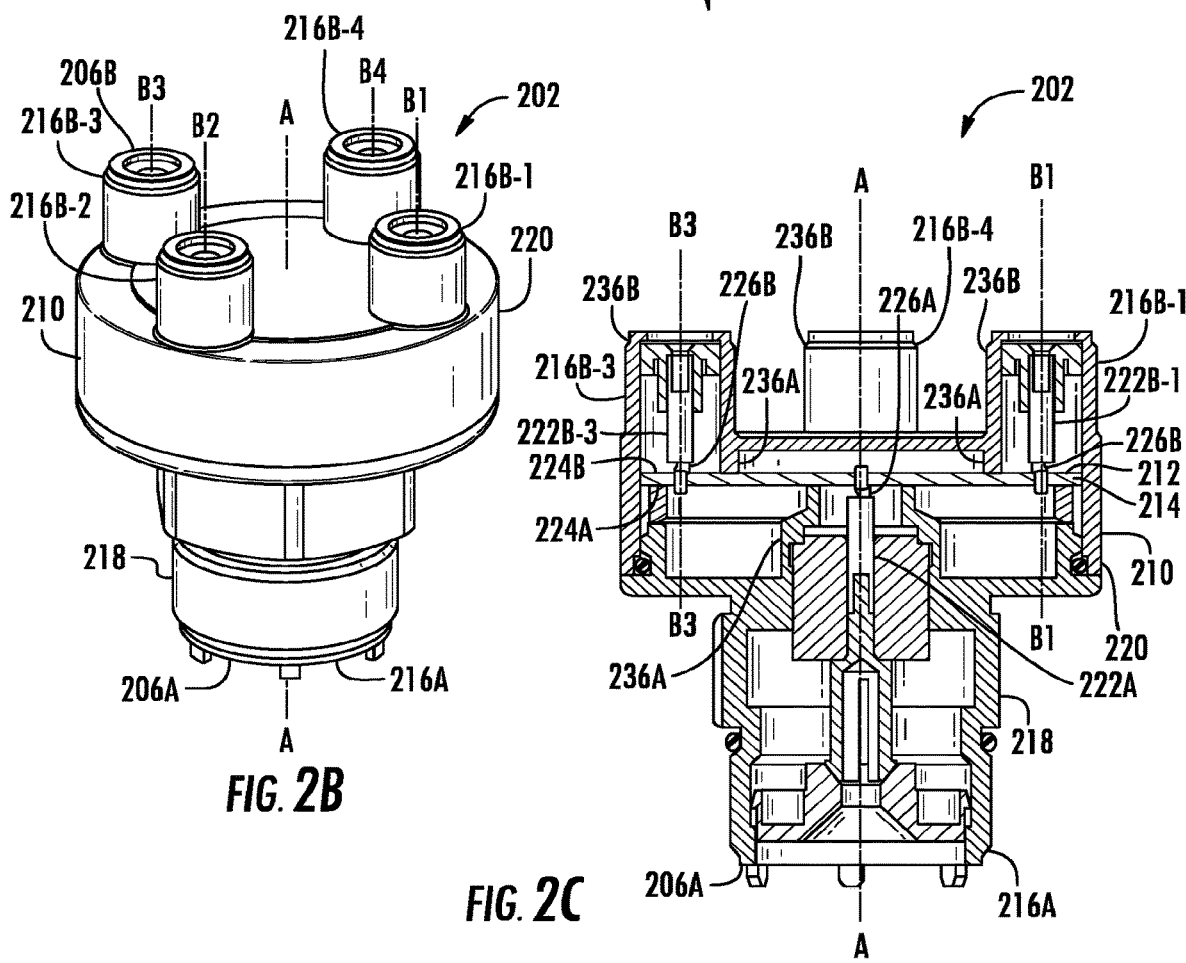
FIG. 2B
FIG. 2C

HARDLINE SPLITTER WITH DIRECT CONNECTION

CROSS-REFERENCE TO RELATED APPLICATION

This application is a continuation of U.S. patent application Ser. No. 16/635,890 filed on Jan. 31, 2020, which claims the benefit of, and priority to, U.S. Provisional Patent Application No. 62/539,070 filed on Jul. 31, 2017, both of which are hereby incorporated by reference in their entireties.

This application is related to U.S. Patent Application Ser. No. 62/539,079, filed concurrently on Jul. 31, 2018, and entitled "SPLITTER WITH IMPEDANCE CONTROLLED PORTS," which is incorporated by reference herein in its entirety. This application is related to U.S. Provisional Application Ser. No. 62/539,116 filed concurrently on Jul. 31, 2017, and entitled "SPLITTER WITH INTEGRAL BRASS PORTS," which is incorporated by reference herein in its entirety. This application is related to U.S. Patent Application Ser. No. 62/539,110, filed concurrently on Jul. 31, 2017, and entitled "SPLITTER WITH IMPEDANCE CONTROLLED PORTS," which is incorporated by reference herein in its entirety.

BACKGROUND

The disclosure relates to splitters, and more particularly to splitters with improved mechanical engagement and electrical performance.

Splitters are frequently used to route signals between different electronic devices and/or electronic components to establish electronic communication therebetween. In particular, hybrid fiber-coaxial (HFC) networks utilize splitters to route signals among various electronic devices and/or electronic components. Such splitters may include an HFC network RF splitter, a power splitter, etc., which may be used within a Network Interface Device (NIDI system or other similar system. It is common for a splitter to be in communication with a telecommunications link (also referred to herein as a communications channel, trunkline, hardline, etc.) that connects exchanges or switchboards over large distances. Such telecommunications links may require one or more adapters to connect the telecommunications link to a splitter.

In this regard, FIGS. 1A and 1B are views illustrating a conventional connector system 100 using a conventional splitter. In particular, FIG. 1A is a view of a conventional splitter 102 connected to an input hardline cable 104 (e.g., for power and/or signal input) and a plurality of output cables 106 (e.g., outputting to one or more homes). As shown, there are a number of junctions between the input hardline cable 104 and the splitter 102. The input hardline cable 104 connects to an adapter 108, which connects to a coaxial jumper cable 110, which then connects to the splitter 102. Accordingly, there are at least three junctions between the input hardline cable 104 and the splitter 102. Each junction affects performance and contributes to signal degradation. However, the coaxial jumper cable 110 is needed to reduce vibrations between the input hardline cable 104 and the splitter 102, as explained below in more detail. However, as shown in FIG. 1B, the jumper cables 110 can lead to clutter which may complicate installation and maintenance.

FIGS. 1C-1E are views of various conventional splitters 112A-112C. Conventional splitters, such as the one shown in FIG. 1C, employ a zinc die cast housing 114, which, while functional, presents various operational challenges, such as maintaining weather sealing or durability. Such problems may be mitigated by using zinc die cast housings with black nickel plating to increase durability, but such improvements are limited and a number of jurisdictions are moving away from or no longer allow full zinc housings. Other splitters use a brass port (e.g., input port 116 and/or output ports 118-1 to 118-5 (referred to collectively as output ports 118) press fit into the zinc die cast housing 114. Brass ports are more durable and allow for tighter connections; however, because brass is harder than zinc, such ports 116, 118 may become loose in the zinc die cast housing 114 due to vibrations or normal use. Alternatively, other splitters may use a NiTin plated brass port 116, 118 attached to the zinc die cast housing 114 using a jam nut, which may be more robust but is also more costly to manufacture. Due to these durability concerns, the coaxial jumper cable 110 is used to reduce the vibrations imparted on the splitter 102 (as shown in FIGS. 1A and 1B). Other alternatives that may be available are typically too difficult and costly to manufacture. For example, it is impractical and costly to machine housing 114 and ports 116, 118 out of brass because of the large size of the splitter 102 and because the ports 116, 118 are perpendicular to a top opening of the housing 114 (covered by a top plate 119).

The conventional splitters of FIGS. 1C-1E include output ports 118 that vary in distance from the input port 116. In particular, FIG. 1D illustrates a conventional sputter with each output port 118 a different distance from the input port 116. In particular, Input port 116 is a first distance DI from output port 118-5, and a second distance D2 from output port 118-4, where D2 is greater than DI. These variable distances may create challenges with signal balancing and distribution, among other performance issues.

FIG. 1E is a perspective view of an interior of a third conventional splitter 112C. As shown, a printed circuit board (PCB) 120 is positioned within the zinc die cast housing 114, and the ports 116, 118 are perpendicular to the PCB 120. Accordingly, there are gaps 122 between an interior of the ports 116, 118 and the PCB 120. These gaps 122 may complicate the ability to control the impedance of the splitter 112C, which may adversely affect performance of the splitter 112C.

FIGS. 1F and 1G are views of a conventional power splitter. In particular, FIG. 1F is a view of a conventional connector system 124 using conventional power splitters 126A, 126B. The power splitter 126A includes an input port 128 and a plurality of output ports 130-1, 130-2 (collectively referred to as output ports 130). The power splitter 126A further includes a base 132 and a cover 134 attached to the base 132 by a plurality of screws 136. Many power splitters 126A require an adapter 138 to be installed in each of the ports 128, 130 to connect an input cable 140 or an output cable 142. This requires the removal of a plurality of screws from the cover 134, which can be difficult and time consuming to install and maintain and also expensive to produce.

FIG. 1 G shows a power splitter 1268 with the cover 134 removed. As shown, the adapter 138 includes a brass pin 144 which must be tightened down with a screw 146. The length and thickness of the brass pin 144 may alter performance of the splitter 1268. Some power splitters 126A, 1268 may come with the adapter 138 preinstalled, but such splitters 126A, 1268 then still have the extra expense and manufacturing complexity of including the adapter 138, and may still be exposed to potential alteration from an operator. Further, such splitters 126A, 126B may require the signal to make one or more 180-degree turns, which can affect performance. Accordingly, such power splitters 126A, 126B may be expensive to manufacture, costly and time consuming to install, prone to human error or human interference, and/or may suffer from suboptimal performance.

No admission is made that any reference cited herein constitutes prior art. Applicant expressly reserves the right to challenge the accuracy and pertinency of any cited documents.

SUMMARY

Embodiments of the disclosure are directed to a splitter with equidistant output ports. In exemplary aspects disclosed herein, the splitter includes a housing, a printed circuit board assembly positioned therein, an input port, and a plurality of output ports. The printed circuit board assembly includes a printed circuit board, an input conductor attached to a first surface of the printed circuit board at an input contact point, and a plurality of output conductors attached to a second surface of the printed circuit board. The printed circuit board is configured to split a signal from the input conductor into a plurality of signals to the plurality of output conductors. The input port is attached to the housing and surrounds at least a portion of the input conductor. The input port is configured to mechanically and electrically engage an input cable. The plurality of output ports is attached to the housing and each surrounds at least a portion of one output conductor of the plurality of output conductors. The plurality of output ports is configured to mechanically and electrically engage an output cable, and includes at least three output ports, wherein each output port of the plurality of output ports, and each of the corresponding output conductors, are circumferentially positioned around the input contact point. Thus, the splitter provides improved signal balance and transfer.

One embodiment of the disclosure relates to a splitter comprising a housing, a printed circuit board assembly, an input port, and a plurality of output ports. The housing defines an interior. The printed circuit board assembly is positioned within the interior of the housing. The printed circuit board assembly comprises a printed circuit board, an input conductor attached to the printed circuit board at an input contact point, and a plurality of output conductors is attached to the printed circuit board. The printed circuit board is configured to split a signal. The input port is attached to the housing and is configured to mechanically and electrically engage an input cable. The input port surrounds at least a portion of the input conductor. The plurality of output ports is attached to the housing. Each output port of the plurality of output ports is configured to mechanically and electrically engage an output cable. The plurality of output ports comprises at least three output ports. Each output port of the plurality of output ports is circumferentially positioned around the input contact point.

An additional embodiment of the disclosure relates to a printed board assembly for a splitter comprising a printed circuit board having a first surface and a second surface, an input conductor, and a plurality of output conductors. The input conductor is attached to the first surface of the printed circuit board at an input contact point. The plurality of output conductors is attached to the printed circuit board. The plurality of output conductors includes at least three output conductors. Each output conductor of the plurality of output conductors is circumferentially positioned around the input contact point. The printed circuit board is configured to split a signal from the input conductor into a plurality of signals to the plurality of output conductors.

One embodiment of the disclosure relates to a splitter, comprising a housing defining an interior, a printed circuit board positioned within the interior of the housing, a plurality of output ports attached to the housing, and an input port attached to the housing. The printed circuit board is configured to split a signal. Each output port of the plurality of output ports is configured to directly mechanically and electrically engage an output cable. The input port is configured to directly mechanically and electrically engage a hardline cable.

An additional embodiment of the disclosure relates to a kit for a splitter connector system comprising a splitter and a hardline nut. The splitter comprises a housing defining an interior, a printed circuit board positioned within the interior of the housing, a plurality of output ports attached to the housing, and an input port attached to the housing. The printed circuit board is configured to split a signal. Each output port of the plurality of output ports is configured to directly mechanically and electrically engage an output cable. The input port is configured to directly mechanically and electrically engage a hardline cable. The hardline nut is configured for permanent attachment to the hardline cable and to mechanically engage the input port of the splitter.

One embodiment of the disclosure relates to a splitter comprising a housing, a printed circuit board, an input port, and a plurality of output ports. The housing comprises a body portion and a head portion. The body portion and the head portion are non-integrally attached to one another and define an interior of the housing. The printed circuit board is positioned within the interior of the housing. The printed circuit board is configured to split a signal. The input port is integrally attached to the body portion of the housing. The input port is configured to mechanically and electrically engage an input cable. The plurality of output ports are integrally attached to the head portion of the housing. Each output port of the plurality of output ports is configured to mechanically and electrically engage an output cable.

An additional embodiment of the disclosure relates to a splitter comprising a housing, a printed circuit board, an input port, and a plurality of output ports. The housing comprises brass and defines an interior. The printed circuit board is positioned within the interior of the housing. The printed circuit board is configured to split a signal. The input port comprises brass and is integrally attached to the housing. The input port is configured to mechanically and electrically engage an input cable. The plurality of output ports comprises brass and is integrally attached to the housing. Each output port of the plurality of output ports is configured to mechanically and electrically engage an output cable.

One embodiment of the disclosure relates to a splitter comprising a housing defining an interior, a printed circuit board assembly positioned within the interior of the housing, and a plurality of ports attached to the housing. The printed circuit board assembly comprises a printed circuit board and a plurality of conductors connected to the printed circuit board. The printed circuit board is configured to split a signal. The plurality of conductors comprises an input conductor and a plurality of output conductors. The plurality of ports comprises an input port and a plurality of output ports. The input port is configured to mechanically and electrically engage an input cable. Each output port of the plurality of output ports is configured to mechanically and electrically engage an output cable. At least one port of the plurality of ports comprises an outer portion and an inner portion. The outer portion extends outward from an exterior of the housing. The inner portion extends inward from the interior of the housing proximate a surface of the printed circuit board and surrounds at least a portion of one conductor of the plurality of conductors.

An additional embodiment of the disclosure relates to a splitter comprising a housing defining an interior, a printed circuit board assembly positioned within the interior of the housing, and a plurality of ports attached to the housing. The printed circuit board assembly comprises a printed circuit board and a plurality of conductors. Each conductor of the plurality of conductors is connected to the printed circuit board at a contact point. The printed circuit board is configured to split a signal. The plurality of conductors comprises an input conductor and a plurality of output conductors. The plurality of ports comprises an input port and a plurality of output ports. The input port is configured to mechanically and electrically engage an input cable. Each output port of the plurality of output ports is configured to mechanically and electrically engage an output cable. At least a portion of the housing contacts the printed circuit board and surrounds at least one contact point of the plurality of conductors.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

BRIEF DESCRIPTION OF THE DRAWINGS

FIG. 2A is a view of a connector system illustrating an exemplary splitter connected to a hardline cable and a plurality of output cables;

FIG. 2B is a perspective view of the splitter of FIG. 2A;

FIG. 2C is a cross-sectional view of the splitter of FIG. 2A;

FIG. 5A is a side view of the splitter of FIGS. 2A-2C;

FIG. 5B is a cross-sectional side view of the splitter of FIG. 6A;

FIG. 5C is a cross-sectional exploded side view of the splitter of FIG. 6A;

DETAILED DESCRIPTION

Figure 1B:
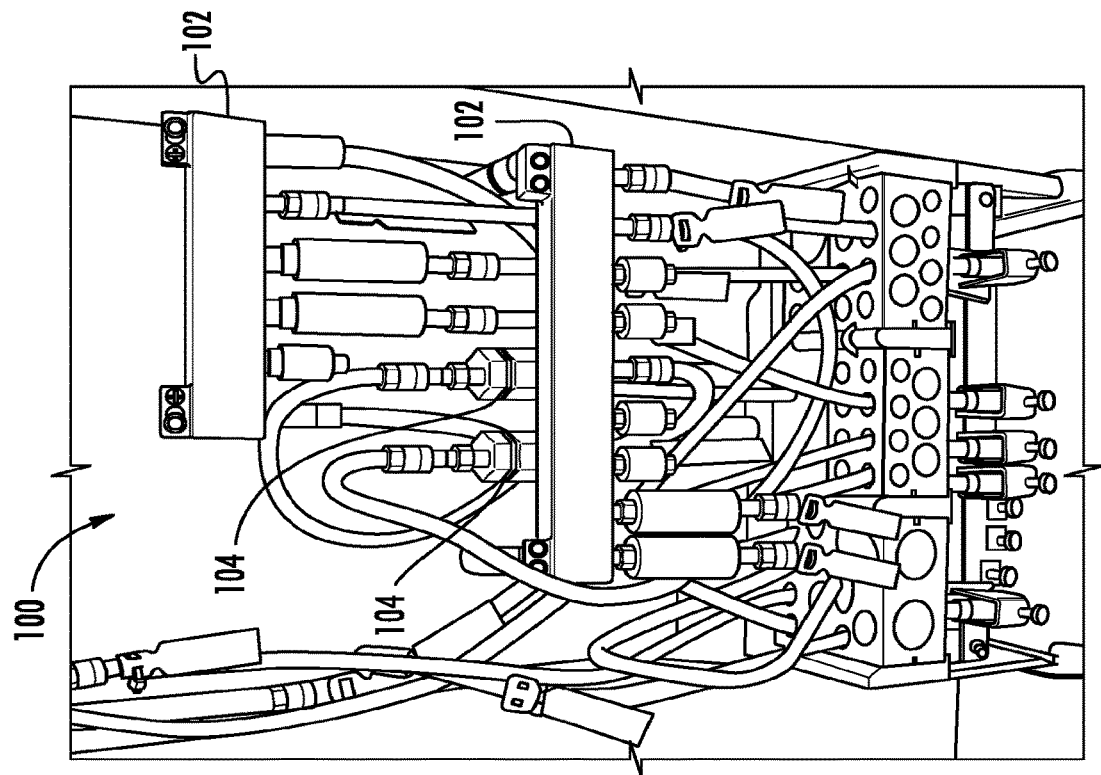
FIG. 1B is a view of a convention connector system including a plurality of conventional splitters connected to a plurality of hardlines by a plurality of jumper cables.
Figure 1A:
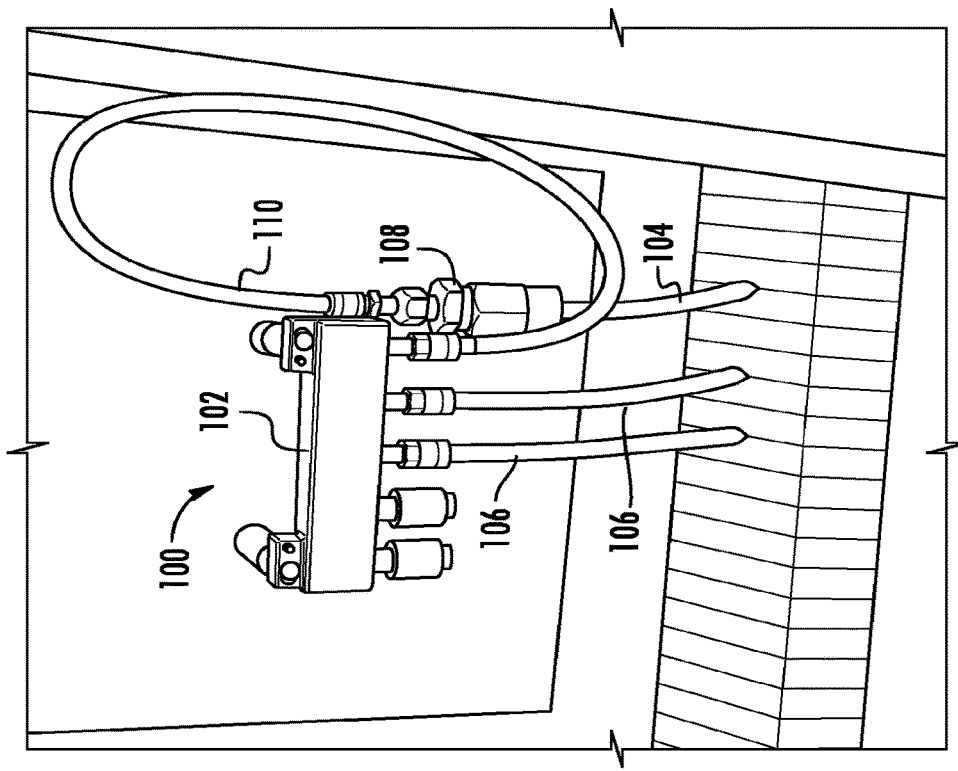
FIG. 1A is a view of a conventional connector system using a conventional splitter connected to a hardline.
Figure 1C:
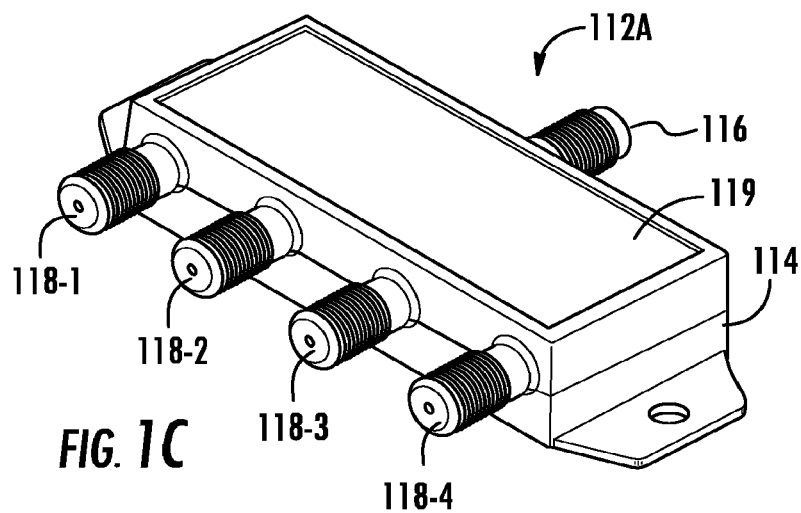
FIG. 1C is a perspective view of a first configuration of a conventional sputter of FIGS. 1A and 1B.
Figure 1D:
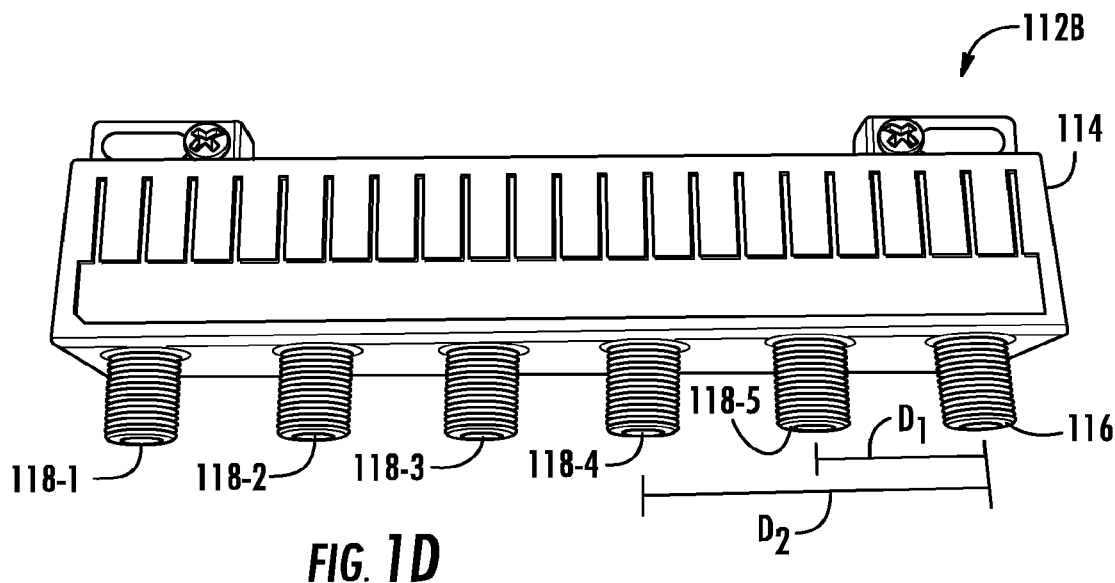
FIG. 1D is a perspective view of a second configuration of a conventional splitter of FIGS. 1A and 1B.
Figure 1E:
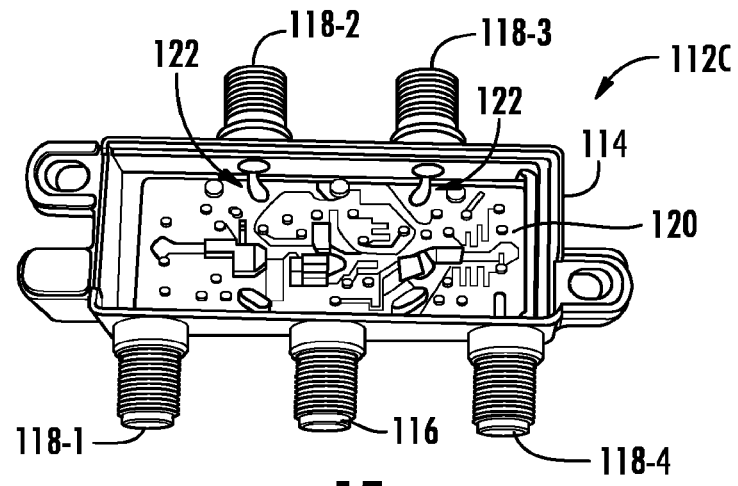
FIG. 1E is a perspective view of an interior of a third configuration of a conventional splitter of FIGS. 1A and 1B.
Figure 1F:
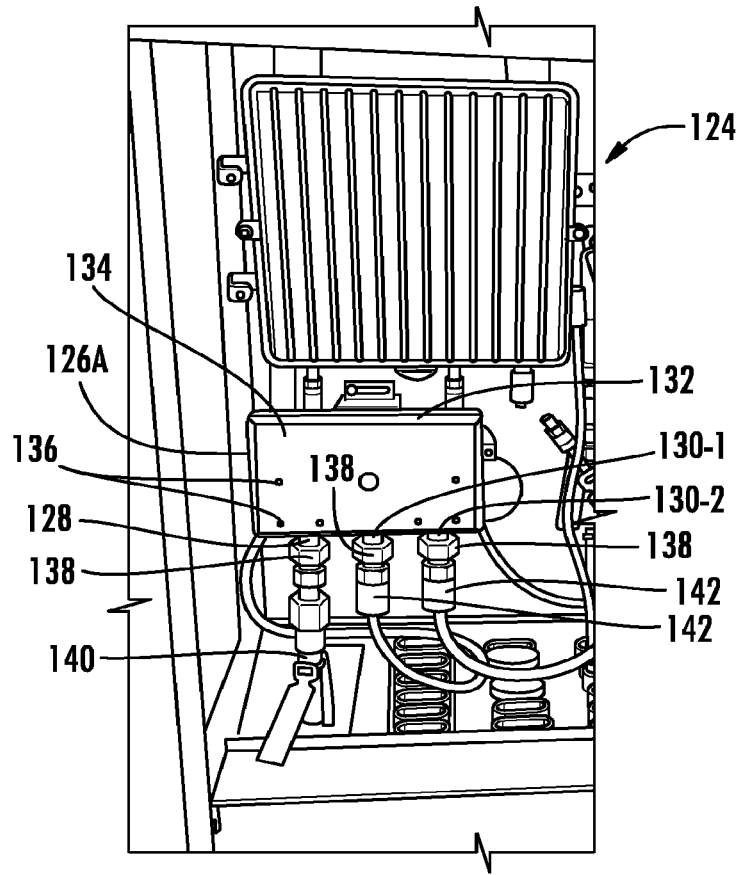
FIG. 1F is a view of a conventional connector system using a conventional power splitter.
Figure 1G:
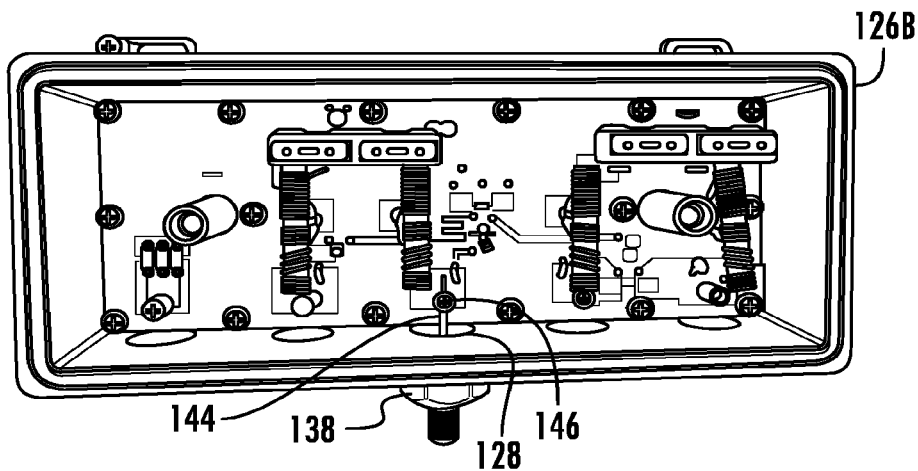
FIG. 1G is a perspective view of an interior of a configuration of a conventional power splitter of FIG. 1F.

Embodiments of the disclosure are directed to a splitter with equidistant output ports. In exemplary aspects disclosed herein, the splitter includes a housing, a printed circuit board assembly positioned therein, an input port, and a plurality of output ports. The printed circuit board assembly includes a printed circuit board, an input conductor attached to a first surface of the printed circuit board at an input contact point, and a plurality of output conductors attached to a second surface of the printed circuit board. The printed circuit board is configured to split a signal from the input conductor into a plurality of signals to the plurality of output conductors. The input port is attached to the housing and surrounds at least a portion of the input conductor. The plurality of output ports is attached to the housing and each surrounds at least a portion of one output conductor of the plurality of output conductors. The plurality of output ports includes at least three output ports, wherein each output port of the plurality of output ports, and each of the corresponding output conductors, are circumferentially positioned around the input contact point. Thus, the splitter provides improved signal balance and transfer.

Embodiments of the disclosure are directed to a splitter with an integral hardline connection. In exemplary aspects disclosed herein, the splitter includes a housing with a printed circuit board positioned therein and configured to split a signal, an input port, and a plurality of output ports attached to the housing. The plurality of output ports is configured to directly mechanically and electrically engage an output cable. The input port is configured to directly mechanically and electrically engage a hardline cable. Further, a kit may be provided which includes the splitter and a hardline nut configured for permanent attachment to the hardline cable and to mechanically engage the input port of the splitter. Thus, the splitter provides direct connection to the hardline cable, which minimizes the number of electrical junctions (and associated connectors and cables) between the hardline cable and the splitter. This configuration facilitates ease of installation, decreases costs, improves performance, and decreases space requirements.

Embodiments of the disclosure are directed to a splitter with integral brass ports. In exemplary aspects disclosed herein, the splitter includes a housing, a printed circuit board positioned therein and configured to split a signal, an input port, and a plurality of output ports. The housing includes a body portion and a head portion non-integrally attached to one another. The input port is integrally attached to the body portion of the housing, and the plurality of output ports is integrally attached to the head portion of the housing. The housing, input port, and plurality of output ports include brass. Thus, the splitter provides a robust housing and ports suitable for exterior cable connections for increased durability and reliability, where the integral construction better resists damage and decay, such as that associated with vibrations. This configuration facilitates ease of manufacturing, decreases cost, and improves performance longevity.

Embodiments of the disclosure are directed to a splitter with impedance controlled ports. In exemplary aspects disclosed herein, the splitter comprises a housing defining an interior, a printed circuit board assembly positioned within the interior of the housing, and a plurality of ports attached to the housing. The printed circuit board assembly comprises a printed circuit board and a plurality of conductors connected to the printed circuit board. The plurality of conductors comprises an input conductor and a plurality of output conductors. Each conductor of the plurality of conductors is connected to the printed circuit board at a contact point. At least a portion of the housing contacts the printed circuit board and surrounds at least one contact point of the plurality of conductors to control impedance. For example, in certain embodiments disclosed herein, at least one port of the plurality of ports comprises an outer portion and an inner portion. The outer portion extends outward from an exterior of the housing. The inner portion extends inward from the interior of the housing proximate a surface of the printed circuit board and surrounds at least a portion of one conductor of the plurality of conductors. The splitter controls impedance within the housing to and from the printed circuit board. Thus, the splitter provides improved performance.

Reference will now be made in detail to the present preferred embodiments, examples of which are illustrated in the accompanying drawings. Whenever possible, the same reference numerals will be used throughout the drawings to refer to the same or like parts.

In this regard, FIGS. 2A-2C are views of a connector system 200 illustrating an exemplary splitter 202 (also referred to herein as a connector) connected to a hardline cable 204 (also referred to herein as an hardline cable assembly, input cable, input cable assembly, etc.) at a first end 206A of the splitter 202 and a plurality of output cables 208 (also referred to herein as an output cable assemblies, output coaxial cables, etc.) at a second end 206B of the splitter 202 (the second end 206B opposite the first end 206A). The splitter 202 is shown as a hybrid-fiber (HFC) splitter, but the splitter 202 and the features associated therewith may be applied to various other types of splitters, such as a coaxial splitter, power splitter, etc., as described in more detail below.

In exemplary aspects disclosed herein, the splitter 202 includes a housing 210 (also referred to herein as a housing assembly, etc.) with a printed circuit board assembly 212 (and associated printed circuit board 214) positioned therein and configured to split a signal. The splitter 202 further includes an input port 216A attached to the housing 210, and a plurality of output ports 216B-1 to 216B-4 (referred to collectively as output ports 216B) attached to the housing 210. The housing 210 includes a body 218 (also referred to herein as a body portion) and a head 220 (also referred to herein as a head portion) non-integrally attached to one another. Referring to FIG. 2C, the printed circuit board assembly 212 includes a printed circuit board (PCB) 214, an input conductor 222A attached to a first surface 224A of the PCB 214 at an input contact point 226A, and a plurality of output conductors 222B-1 to 222B-4 (collectively referred to as output conductors 222B) attached to a second surface 224B of the PCB 214 at an output contact point 226B. The PCB 214 is configured to split a signal from the input conductor 222A into a plurality of signals to the plurality of output conductors 222B.

Referring to FIGS. 2A and 2B, the input port 216A defines axis A-A and is integrally attached to the housing body 218 of the housing 210 and surrounds at least a portion of the input conductor 222A. The input port 216A with integral hardline engagement feature (e.g., threads) is configured to directly mechanically and electrically engage a hardline cable 204. A kit 228 may be provided which includes the splitter 202 and a hardline back nut 230 configured for permanent attachment to the hardline cable body 232 of the hardline cable 204 and to mechanically engage the input port 216A of the splitter 202. Thus, the integral hardline connection of the splitter 202 provides direct connection to the hardline cable 204, which minimizes the number of electrical junctions (and associated connectors and cables) between the hardline cable 204 and the splitter 202 (e.g., no need for jumper cable or adapters), as shown in FIG. 2A. This configuration facilitates ease of installation, decreases costs, improves performance, and decreases space requirements. For example, the splitter 202 has better insertion loss, better signal distribution, and decreased distortion generation (due to decreased number of junctions). Additionally, fewer junctions allows the splitter 202 to split the signal earlier than in other HFC networks.

Referring to FIGS. 2A-2C, the plurality of output ports 216B-1 to 216B-4 define axes B1-B1 to B4-B4 and is integrally attached to the head 220 of the housing 210 and surrounds at least a portion of one output conductor 222B of the plurality of output conductors 222B. The plurality of output ports 216B is configured to directly mechanically and electrically engage an output cable 208. The plurality of output ports 216B includes at least three output ports 216B, wherein each output port 216B of the plurality of output ports 216B, and each of the corresponding output conductors 222B, are circumferentially positioned around the input contact point 226A and equidistant therefrom (within 1 mm). In other words, each of axes B1-B1 to B4-B4 are equidistant (within 1 mm) from axes A-A. The equidistant output ports 216B of the splitter 202 provide improved signal balance and transfer, as well as more consistent performance between each of the output ports 216B. For example, the splitter 202 has better signal distribution.

The housing 210, input port 216A, and plurality of output ports 216B include brass, and are integrally formed with each other. The term "integral," as used herein, means monolithic, formed together, one piece construction, etc. In other words, the ports 216A, 216B and housing 210 are not attached to each other by a press fit or fastener. The ports 216A, 216B and housing 210 may be formed by molding, etc. However, in other embodiments, the ports 216A, 216B and housing 210 may not be integral. The integral brass ports 216A, 216B of the splitter 202 provide a robust housing 210 and ports 216A, 216B suitable for exterior cable connections for increased durability and reliability, where the integral construction better resists damage and decay, such as that associated with vibrations. This configuration facilitates ease of manufacturing, decreases cost, and improves performance longevity.

Referring to FIG. 2C, at least a portion of the housing 210 (e.g., input port 216A, one or more output ports 216B, etc.) contacts the PCB 214 and surrounds at least one contact point 226A, 226B of the plurality of conductors 222A, 222B to control impedance. For example, in certain embodiments disclosed herein, at least one port 216A, 216B of the plurality of ports 216A, 216B comprises an outer portion and an inner portion. In particular, housing body 218 includes an inner wall 236A extending proximate the first surface 224A of the PCB 214 and surrounding at least a portion of the input conductor 222A. Further, the output ports 216B include an inner wall 236A (also referred to as an inner portion) and an outer wall 236B (also referred to an outer portion). The inner wall 236A extends inward from the interior of the housing 210 proximate the second surface 224B of the PCB 214 and surrounds at least a portion of the output conductor 222B of the plurality of conductors 222B. The outer wall 236A extends outward from an exterior of the housing 210. The splitter 202 controls impedance within the housing 210 to and from the PCB 214. The impedance controlled ports 216A, 216B of the splitter 202 provide improved performance. For example, the splitter 202 has decreased distortion generation.

It is noted that the splitter 202 may be mounted to the hardline cable 204 without any additional support or mounting structure due to the thickness of the hardline cable 204. In other embodiments, the splitter 202 maybe mounted to a panel by a clip, cable tie, or other fastener.

Figure 3A:
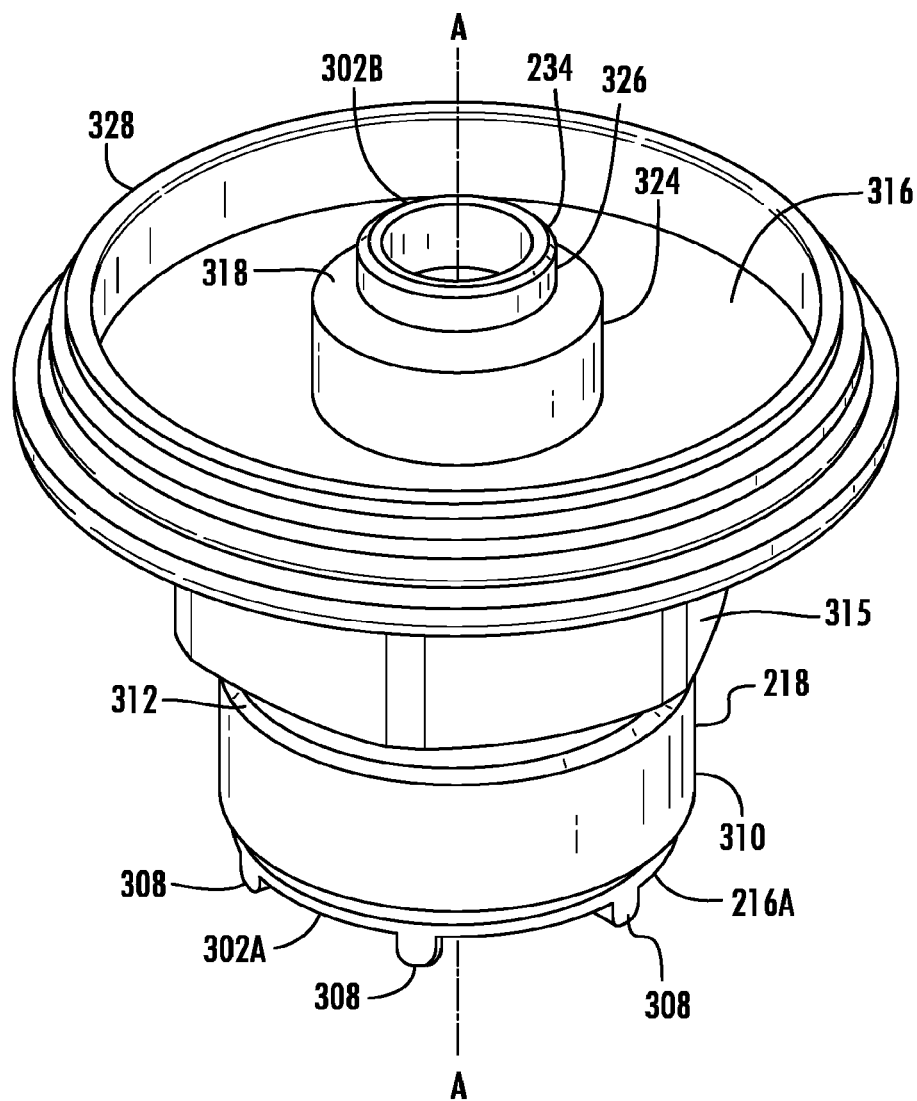
FIG. 3A is a perspective view of a housing body of the splitter of FIGS. 2A-2C and a center pin mounted therein.
Figure 3B:
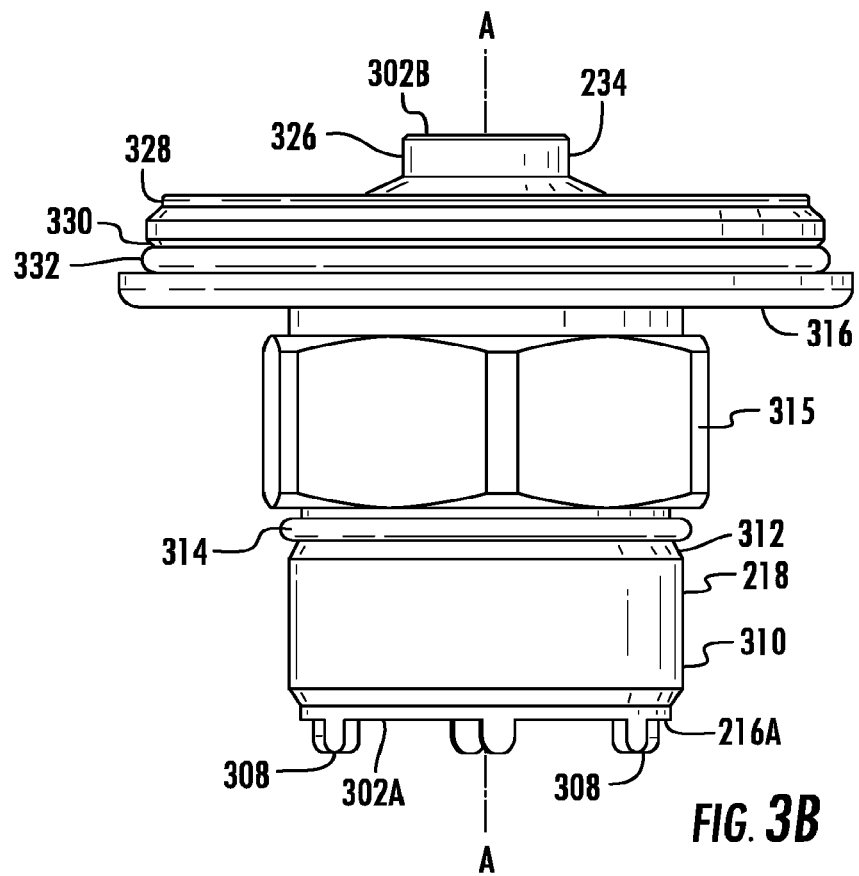
FIG. 3B is a side view of the housing body of FIG. 3A.
Figure 3C:
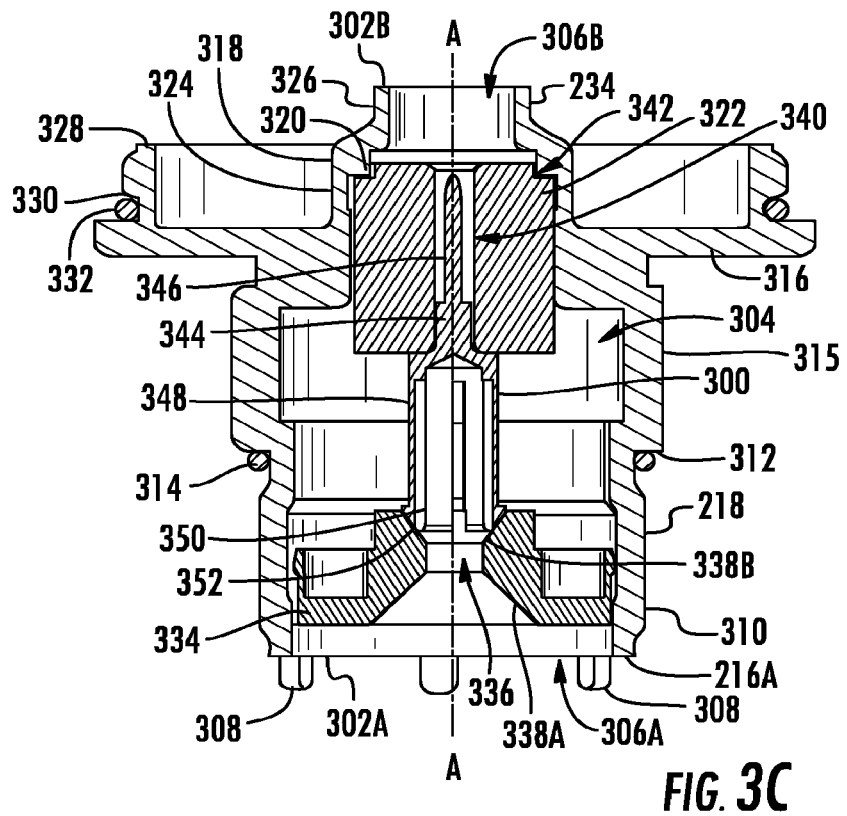
FIG. 3C is a cross-sectional side view of the housing body of FIG. 3A.

FIGS. 3A-3E are views of the housing body 218 and a center pin 300 mounted therein. Referring to FIGS. 3A-3C, the housing body 218 includes a first end 302A, a second end 302B opposite the first end 302A, and a central axis A-A extending therethrough. Further, the housing body 218 includes an interior 304 extending from the first end 302A to the second end 302B with a first opening 306A at the first end 302A and a second opening 306B at the second end 302.

The input port 216A at the first end 302A includes a plurality of locking prongs 308 (also referred to as an integral splitter locking feature) extending from the first end 302A along axis A-A. The locking prongs 308 engage the hardline back nut 230 of the hardline cable 204 to prevent inadvertent rotation of the splitter 202 relative to the hardline back nut 230 to facilitate engagement therebetween, as explained in more detail below. An external surface of the housing body 218 proximate the input port 216A may include a threaded portion 310 (also referred to herein as external threads) to threadably engage the hardline back nut 230 of the hardline cable 204. However, other engagement features or mechanisms may be used, such as frictional engagement (without threads).

Proximate the threaded portion 310 (towards the second end 302B) is an annular groove 312 to receive and retain a first o-ring 314 (also referred to herein as a sealing gasket) therein. The first o-ring 314 provides a seal between the splitter housing 210 and the hardline back nut 230 of the hardline cable 204. Proximate the annular groove 312 (towards the second end 302B) is a hexagonal portion 315 (e.g., integral nut) in the external surface of the housing body 218, such that the annular groove 312 is positioned between the threaded portion 310 and the hexagonal portion 315. The hexagonal portion 315 provides a gripping surface for tightening the splitter 202 and the hardline back nut 230 of the hard line cable 204, such as via a wrench. However, other gripping surfaces and shapes may be used.

A perpendicular intermediate wall 316 extends proximate the hexagonal portion 315 (towards the second end 302B), such that the hexagonal portion 315 is positioned between the annular groove 312 and the intermediate wall 316. The intermediate wall 316 extends generally perpendicularly from the axis A-A. The outer diameter of the intermediate wall 316 is larger than the outer diameter of the input port 216A, threaded portion 310, and/or hexagonal portion 315.

An inner wall 318 extends from a top surface along axis A-A and defines the second opening 306B. In particular, the inner wall 318 includes an inner shoulder 320 with a cylindrical dielectric 322 mounted thereto, as explained below in more detail. Further, the inner wall 318 includes a lower portion 324 and an upper portion 326, where the upper portion 326 may have a smaller inner diameter than the lower portion 324. For example, the upper portion 326 is tapered relative to the lower portion 324. The size of the upper portion 326 and the second opening 306B defined by the upper portion 326 may vary depending on the electrical performance (e.g., impedance) requirements of the splitter 202, as explained below in more detail.

The housing body 218 further includes an outer wall 328 extending from a top surface along axis A-A. The outer wall 328 is offset from an outer peripheral edge of the intermediate wall 316 to provide a mounting surface for the head 220, as explained below in more detail. Further, the outer wall 328 includes an annular groove 330 defined in an exterior surface thereof to receive a second o-ring 332 therein. The second o-ring 332 provides a seal between the housing body 218 and the housing head 220, as explained below in more detail. The height of the outer wall 328 is less than that of the inner wall 318 for engaging the housing head 220 and PCB 214, as explained in more detail below.

Figure 3D:
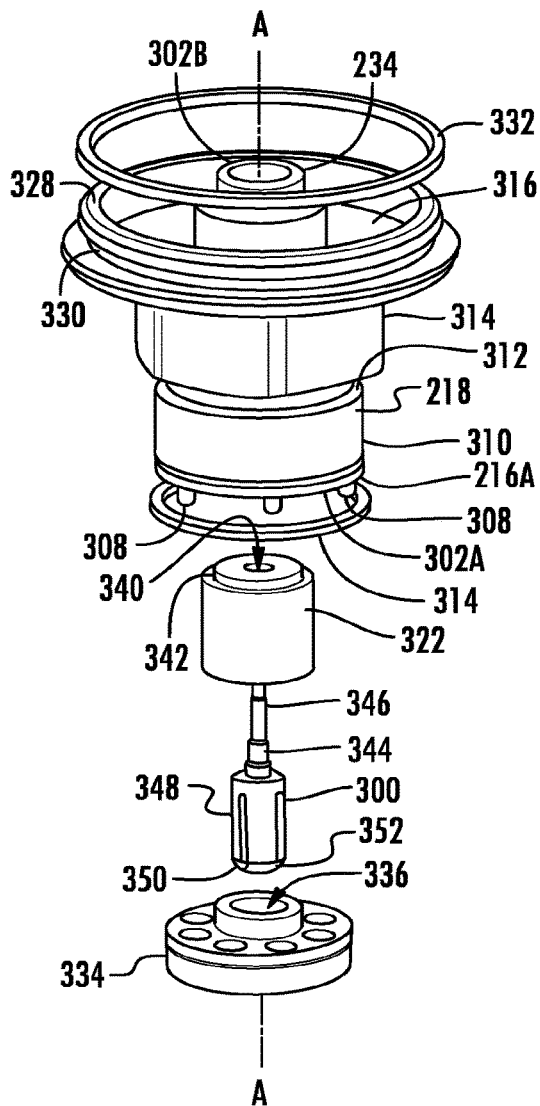
FIG. 3D is an exploded perspective view of the housing body of FIG. 3A.
Figure 3E:
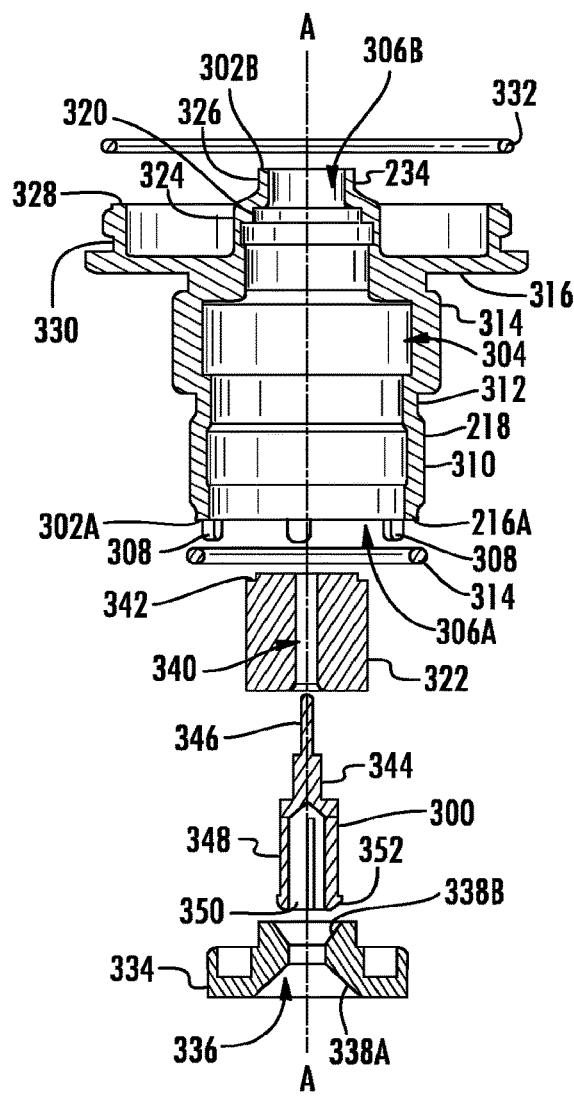
FIG. 3E is a cross-sectional exploded side view of the housing body of FIG. 3A.

Referring to FIGS. 3C-3E, the splitter 202 further includes a center pin 300 mounted within the splitter 202 by the cylindrical dielectric 322 and an input port dielectric 334. The input port dielectric 334 includes a central through hole 336 having an input engagement taper 338A at one end of the central through hole 336 (towards the first end 302A) and a pin mounting taper 338B at an opposite end of the central through hole 336 (towards the second end 302B). The input port dielectric 334 may be press fit within the housing body 218 proximate the first opening 306A.

The cylindrical dielectric 322 includes a central channel 340 extending therethrough and an annular recess 342 at an end of the cylindrical dielectric 322. The cylindrical dielectric 322 may be press fit within the housing body 218 proximate the second opening 306B such that the annular recess 342 receives at least a portion of the inner shoulder 320 of the inner wall 318 of the housing body 218 therein. In this way, the outer diameter of the cylindrical dielectric 322 is about or substantially the same size as the inner diameter (e.g., within 5% difference) of the lower portion 324 of the inner wall 318 and less than the inner diameter of the upper portion 326. Thus, the inner shoulder 320 and the upper portion 326 of the inner wall 318 prevent the cylindrical dielectric 322 from translating through the second opening 306B of the housing body 218.

The center pin 300 includes a cylindrical body 344 with a male end 346 which is tapered for insertion into the input conductor 222A (shown in FIG. 2C), as discussed in more detailed below. The center pin 300 further includes a plurality of strips 348 axially extending from the cylindrical body 344 (opposite the male end 346). The strips 348 are circumferentially positioned to define a female end 350. The strips 348 are outwardly biased and include a taper 352 at an end of the strips 348. The taper 352 of the strips 348 of the center pin 300 corresponds in size and shape to the pin mounting taper 338B of the input port dielectric 334. In this way, the center pin 300 is mounted within and electrically insulated from the housing body 218. In particular, the female end 350 is axially aligned with and positioned proximate the through hole 336 of the input port dielectric 334, and the male end 346 of the center pin 300 is positioned within (or proximate to) the lower portion 324 (and/or the upper portion 326) of the inner wall 318 of the housing body 218.

It is noted that the features described above are axially aligned with one another (along axis A-A) and are generally circular. In particular, the input port 216A is aligned with the second opening 306B of the housing body 218 as well as the housing body 218 itself. Thus, the input port 216A and housing body 218 are practical and cost effective to integrally manufacture, such as by drilling, milling, a computer numeric control (CNC) machine, etc.

FIGS. 4A-4I are views of a splitter housing head of the splitter 202 of FIGS. 2A-2C. Referring to FIGS. 4A-4E, views of the housing head 220 of the housing head 220 are shown. The housing head 220 includes a first end 400A and a second end 400B opposite the first end 400A, and a central axis A-A extending therethrough. Further, the housing body 218 includes an interior 402 extending from the first end 400A to the second end 400B with a first opening 404A at the first end 400A and a plurality of second openings 404B at the second end 400B.

The housing head 220 includes a peripheral wall 406 which is generally circular and an upper wall 408 extending generally perpendicularly from an end of the peripheral wall 406. A groove 410 is defined proximate a first end 400A in an inner surface of the peripheral wall 406. The groove 410 provides clearance to receive the second o-ring 332 (see FIGS. 3A-3E) therein, as explained in more detail below. The upper wall 408 defines a central recess 412 within an inner surface of the upper wall 408 to provide clearance for electronic components on the PCB 214, as explained in more detail below.

A plurality of output ports 216B-1 to 216B4 extend upward from the upper wall 408 of the housing head 220. Each output port 216B includes an inwardly extending flange 414 defining the second opening 404B to retain an output dielectric therein, as explained in more detail below. The plurality of output ports 216B define theft own axis B1-B1 to B4-B4 (referred to collectively as axes B-B). The axes B-B of the output ports 216B are generally parallel with and extend in the same direction as axis A-A of the housing body 218. The plurality of output ports 216B are circumferentially positioned around and approximately equidistant from the central axis A-A for improved electrical performance, as explained in more detail below. In particular, the plurality of output ports 216B are positioned proximate the peripheral wall 406 and are equidistant from the central axis A-A within 1 mm of one another (e.g., within 0.5 mm of one another, within 0.1 mm of one another, etc.). Output port 216B-1 is purposefully offset (e.g., within 0.5 mm, 0.1 mm, etc.) compared to output ports 216B-2 to 216B-4 to indicate proper orientation of the housing head 220 relative to the conductors 222A, 222B of the PCB board assembly 212. In this way, output ports 216B-2 to 216B-4 are equidistant from the central axis A-A within 1 mm of one another (e.g., within 0.5 mm, 0.1 mm, etc.). Output ports 216B-2 to 216B-4 define grooves 416 within an inner surface of the peripheral wall 406, and output port 216B-1 does not define a groove. These grooves 416 ensure that the housing head 220 and PCB board assembly 212 can only be assembled in one orientation, as explained below in more detail. Further, output ports 216B are circumferentially spaced so that the output ports 216B are rotationally equidistant from each adjacent output port 216B. For example, output port 216B-1 is positioned at a zero angle relative to the central axis A-A. Output port 216B-2 is positioned at a 90-degree angle, output port 216B-3 is positioned at a 180-degree angle, and output port 216B-4 is positioned at a 270-degree angle. As shown, all of the output ports 216B are about or substantially equidistant (e.g., within 5% difference), but in other embodiments a majority of output ports 216B are about or substantially equidistant.

It is noted that the features described above are axially aligned with one another (along axis A-A) and are generally circular. In particular, the output ports 216B are aligned with the first opening 404A of the housing head 220 as well as the peripheral wall 406 of the housing head 220. Thus, the output ports 216B and housing head 220 are practical and cost effective to integrally manufacture, such as by drilling, milling, a computer numeric control (CNC) machine, etc.

Figure 4A:
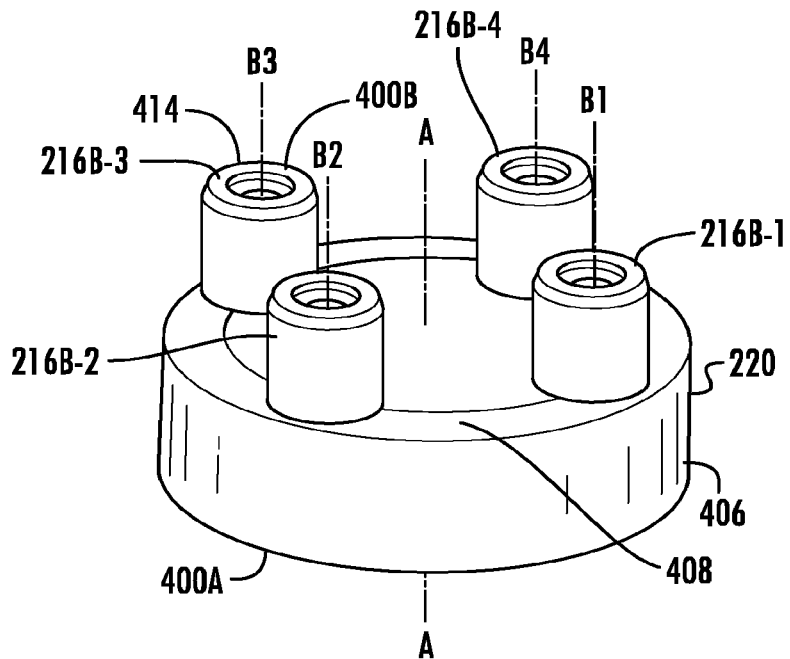
FIG. 4A is a perspective view of a housing head of the splitter of FIGS. 2A-2C.
Figure 4B:
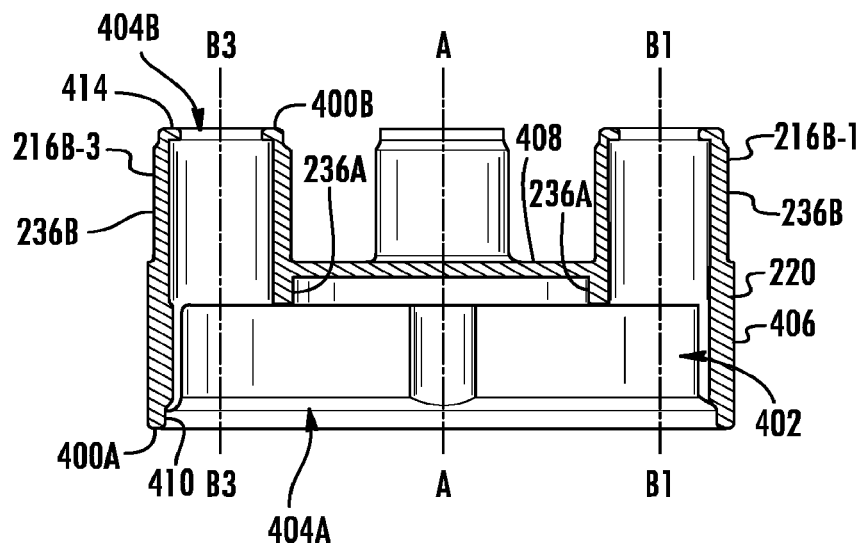
FIG. 4B is a cross-sectional side view of the housing head of FIG. 4A.
Figure 4C:
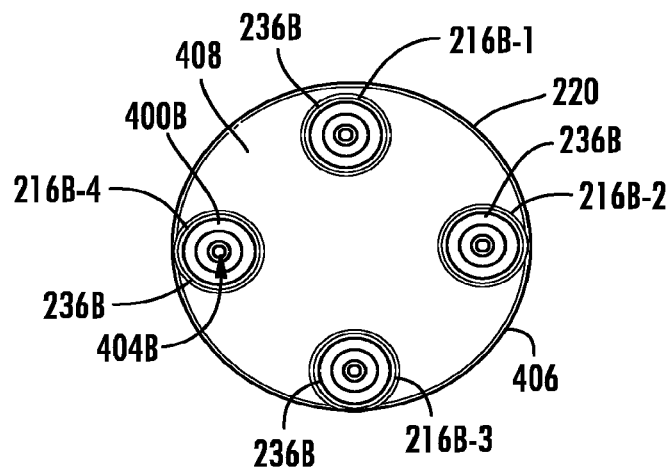
FIG. 4C is a top view of the housing head of FIG. 4A.
Figure 4D:
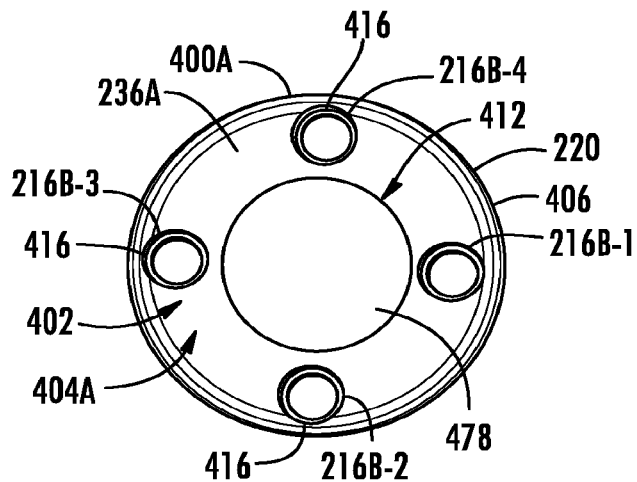
FIG. 4D is a bottom view of the housing head of FIG. 4A.
Figure 4E:
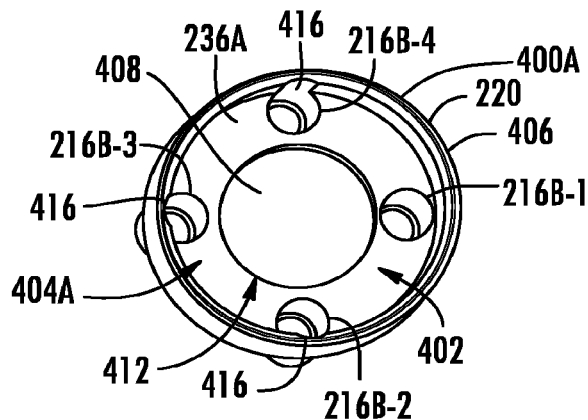
FIG. 4E is a bottom perspective view of the housing head of FIG. 4A.
Figure 4F:
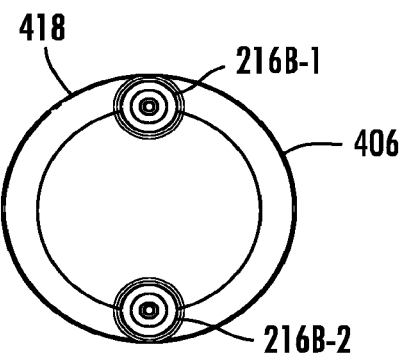
FIG. 4F is a top view of another embodiment of the housing head of FIG. 4A with only two output ports.
Figure 4G:
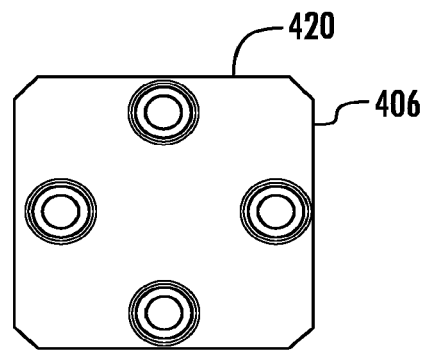
FIG. 4G is a top view of another embodiment of the housing head of FIG. 4A with a square periphery.
Figure 4H:
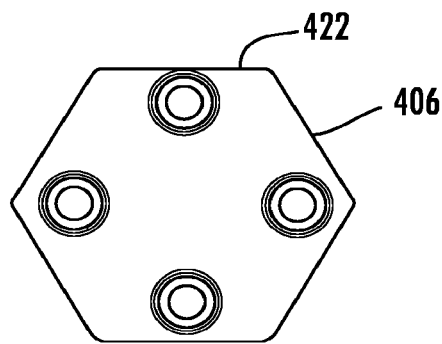
FIG. 4H is a top view of another embodiment of the housing head of FIG. 4A with a hexagonal periphery.
Figure 4I:
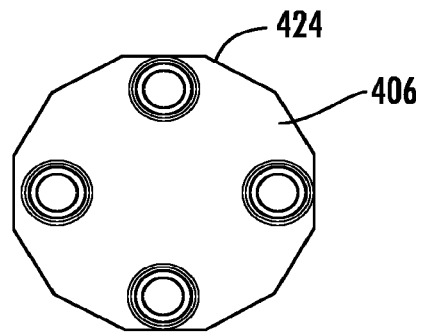
FIG. 4I is a top view of another embodiment of the housing head of FIG. 4A with a dodecagonal periphery.

FIGS. 4F-4I are alternative embodiments of the housing head 220. Referring to FIG. 4F, a splitter housing head 418 includes only two output ports 216B-1 and 216B-2 positioned at opposite ends of the housing head 418. It is noted that the peripheral wall 406 of the housing head 220 of FIGS. 4A-4F is shown as being circular, but the peripheral wall 406 may be any of a variety of shapes and sizes. Referring to FIG. 4G, the alternative embodiment of a splitter housing head 420 includes a peripheral wall 406 in a square shape. Referring to FIG. 4H, the alternative embodiment of a splitter housing head 422 includes a peripheral wall 406 in a hexagonal shape. Referring to FIG. 4I, the alternative embodiment of a splitter housing head 424 includes a peripheral wall 406 in an dodecagonal shape.

Figure 5A:
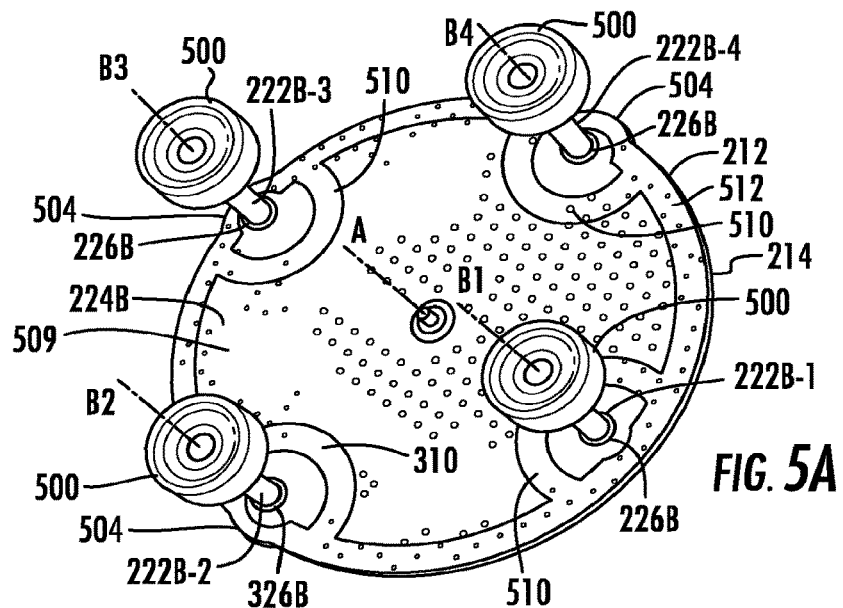
FIG. 5A is a top perspective view of a printed circuit board assembly with output port dielectrics of the splitter of FIGS. 2A-2C.
Figure 5B:
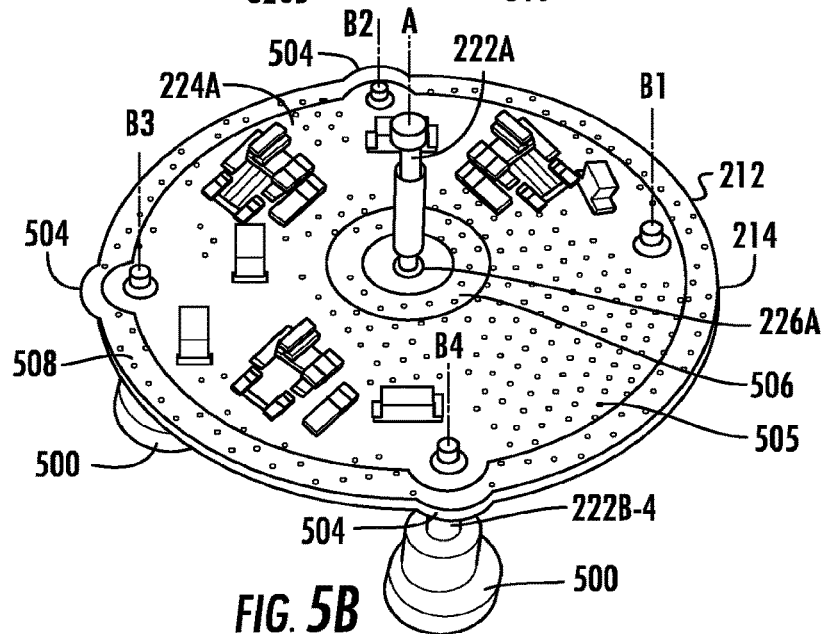
FIG. 5B is a bottom perspective view of the printed circuit board assembly with output port dielectrics of FIG. 5A.
Figure 5C:
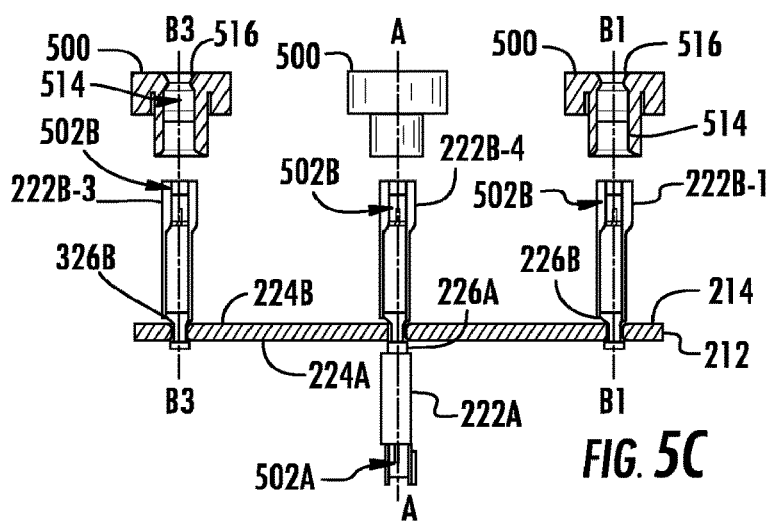
FIG. 5C is a cross-sectional exploded side view of the printed circuit board assembly and output port dielectrics of FIG. 5A.

FIGS. 5A-5C are views of a printed circuit board assembly 212 with a plurality of output port dielectrics 500 mounted thereto. In particular, the printed circuit board assembly 212 defines a center axis A-A and includes a PCB 214 having a first side 224A (also referred to herein as a first surface) and a second side 224B (also referred to herein as a second surface) opposite the first side 224B. The PCB board assembly 212 further includes input conductors 222A mounted to the first side 224A at a first input contact point 226A and a plurality of output conductors 222B-1 to 222B-4 mounted to the second side 224B at a plurality of output contact points 226B. The input conductor 222A defines an interior 502A, and each of the output conductors 222B defines an interior 502B. Each of the conductors 222A, 222B is generally perpendicular to the PCB 214. The input conductor 222A is aligned with the center axis A-A of the PCB board assembly 212 (and corresponding PCB 214).

The plurality of output conductors 222B are positioned and spaced similar to the output ports 216E described with reference to FIGS. 4A-4E. In particular, each of the output conductors 222B is generally parallel with and extend in the same direction as axis A-A of the PCB board assembly 212 and PCB 214. The plurality of output conductors 222B are circumferentially positioned around and approximately equidistant from the central axis A-A and the input conductor 222A for improved electrical performance. Still further, the plurality of output conductors 222B are positioned proximate an outer periphery of the PCB 214 and are equidistant from the central axis A-A within 1 mm of one another (e.g., within 0.5 mm of one another, within 0.1 mm of one another, etc.). Output conductor 222B-1 is purposefully offset (e.g., within 1 mm, 0.5 mm, 0.1 mm) from output conductors 222B-2 to 222B-4. In this way, output ports 216B-2 to 216B-4 are equidistant from the central axis A-A within 1 mm of one another (e.g., within 0.5 mm, 0.1 mm). Further output conductors 222B are circumferentially spaced so that output conductors 222B are rotationally equidistant from each adjacent output conductor 2228. For example, output conductor 222B-1 is positioned at a zero angle relative to the central axis A-A. Output conductor 222B-2 is positioned at a 90-degree angle, output conductor 222B-3 is positioned at a 180-degree angle, and output conductor 222B-4 is positioned at a 270-degree angle. The positioning of the output conductor 222B relative to the input conductor 222A may be varied to alter impedance therebetween. As shown, all of the output conductors 222B are about or substantially equidistant (e.g., within 5% difference), but in other embodiments a majority of output conductors 222B are about or substantially equidistant.

PCB 214 further includes a plurality of nubs 504. Each nub 504 is positioned proximate one of the non-offset output conductors 222B-2 to 222B-4. Each nub 504 is correspondingly sized and shaped to engage the grooves 416 of the housing head 220. As a result, the PCB 214 can only be assembled with the housing head 220 in one orientation, as explained in more detail below.

PCB 214 further includes conductive areas 506-512 indicating mounting areas where the PCB 214 is expected to contact the housing head 220. In particular, the first surface 224A of the PCB 214 includes a non-conductive area 505 (also referred to herein as a grounding area), a conductive inner ring 506 surrounding the input contact point 226A and a conductive outer ring 508 along the outer periphery of the PCB 214. The inner ring 506 indicates the conductive surface where the PCB 214 is configured to contact the inner wall 318 of the housing body 218 and establish a grounding path. The outer ring 508 indicates the conductive surface where the PCB 214 is configured to contact a polymer ring, described below in more detail. Similarly, the second surface 224B of the PCB 214 includes a non-conductive area 509, plurality of a plurality of conductive inner rings 510 at least partially surrounding the output contact points 226B and a conductive outer ring 512 along the outer periphery of the PCB 214. The inner rings 510 and outer rings 512 indicate the conductive surfaces where the PCB 214 is configured to contact the upper wall 408 of the housing head 220. Accordingly, the conductive areas 506-512 may be electrically connected to one another and provide a grounding connection therebetween. Further, the conductive areas 506-512 surround the input conductor 222A (and input contact point 226A) and output conductors 222B (and output contact points 226B) to provide better impedance control. It is noted that the housing head 220 may contact a portion of the non-conductive areas 505, 509 as well as conductive areas 506-512, but that the housing head 220 would not establish an electrical connection or grounding path between the housing head and the non-conductive areas 505, 509.

The plurality of output dielectrics 500 are attached to upper ends of each of the plurality of output conductors 222B. Each output port dielectric 500 includes a central channel 514 and an output engagement taper 516 to facilitate engagement of an output cable 208 with the output ports 216B. The output dielectrics 500 electrically insulate the output conductors 222B from the output ports 216B of the housing head 220.

Figure 6A:
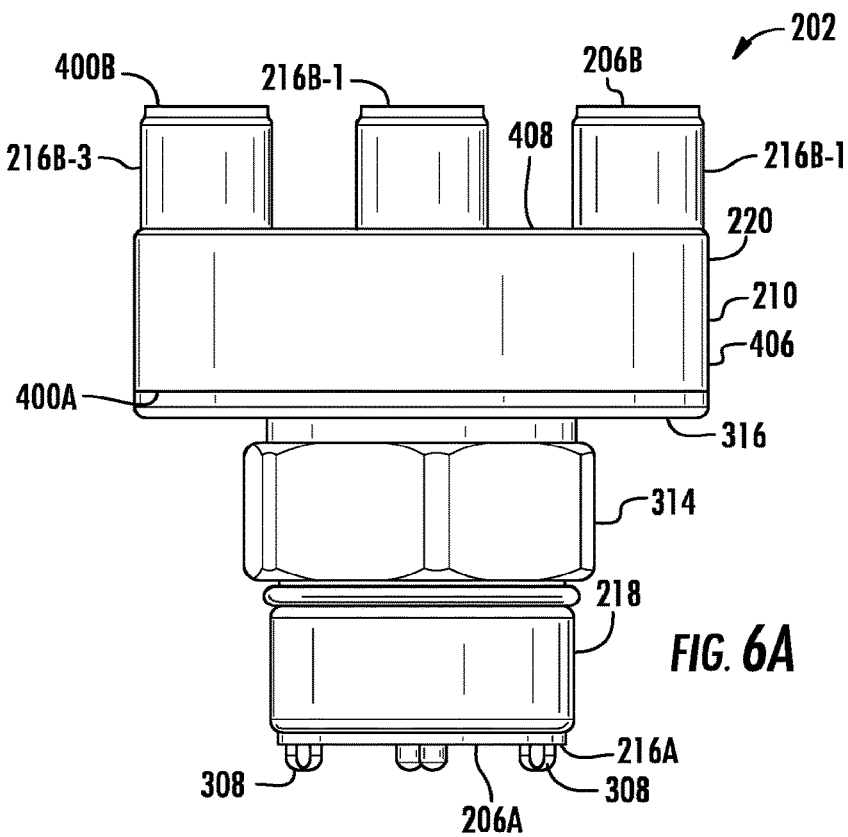
Figure 6B:
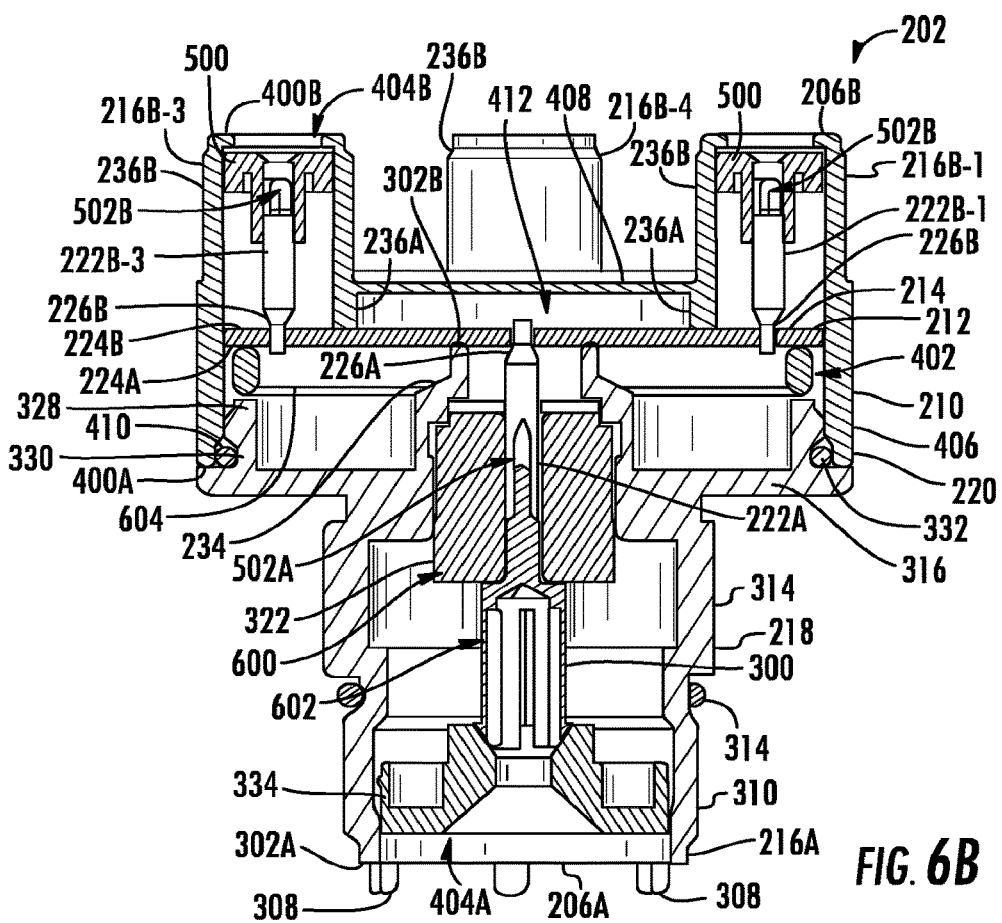
Figure 6C:
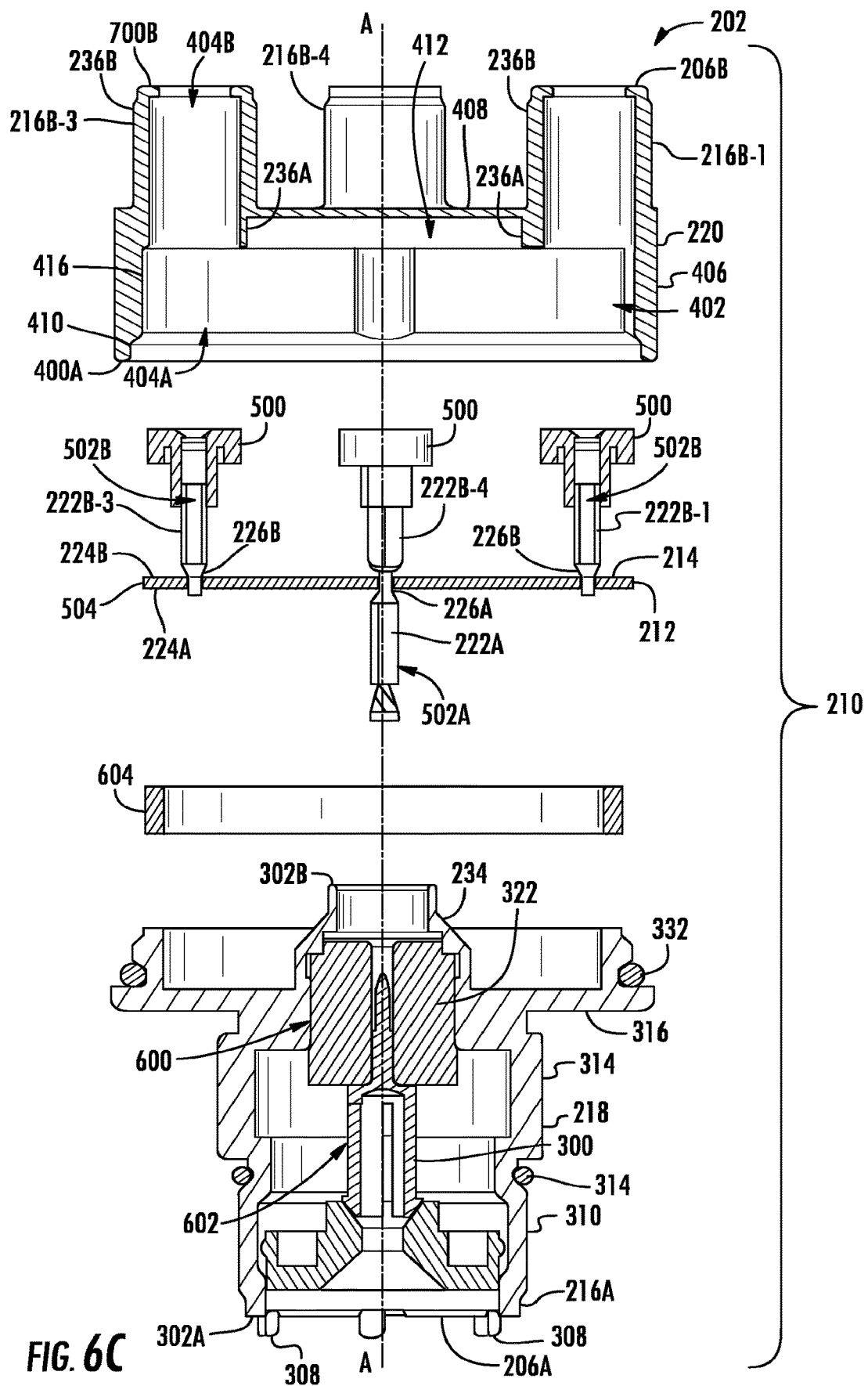

FIGS. 6A-6C are views of the assembled splitter 202. The splitter 202 includes a housing 210, an insulation assembly 600 positioned within the housing, and an electrical assembly 602 positioned within the housing 210. The insulation assembly 600 electrically insulates the housing 210 from the electrical assembly 602. In particular, the insulation assembly 600 includes the input port dielectric 334, the cylindrical dielectric 322, the output p011 dielectric 500, and a polymer ring 604. The electrical assembly 602 includes the PCB board assembly 212 and the center pin 300.

When assembled, the peripheral wall 406 of the housing head 220 is positioned around the outer wall 328 of the housing body 218 such that the first end 400A of the housing head 220 contacts the perpendicular intermediate wall 316 of the housing body 218. Further, the second o-ring 332 is positioned within the annular groove 330 of the outer wall 328 and the groove 410 of the peripheral wall 406 of the housing head 220. The housing head 220 may be press fit to the housing body 218, although other means of attachment may be used. Accordingly, a grounding path is formed from the input port 216A of the housing body 218 to the output ports 216B of the housing head 220.

When assembled, the PCB board assembly 212 is positioned between the housing body 218 and the housing head 220 and the polymer ring 604 is positioned between the PCB 214 and the housing body 218. In particular, the PCB 214 of the PCB board assembly 212 is positioned within the interior 402 of the housing head 220. In this way, the nubs 504 of the PCB 214 are positioned within the grooves 410 of the housing head 220, thereby orienting the PCB 214 and conductors 222A, 222B relative to the housing head 220. This is done to ensure specifications of attenuation and loss for each output port 216B, which may be communicated to a user through a sticker placed on the housing head 220 with indicia proximate the relevant output port 216B. The inner wall 318 of the housing body 218 contacts the inner ring 506 of the first surface 224A of the PCB 214. The polymer ring 604 contacts a top surface of the outer wall 328 of the housing body 218 and the outer ring 508 of the first surface 224A of the PCB 214. A bottom surface of the upper wall 408 contacts the inner ring 510 and outer ring 512 of the second surface 224B of the FOB 214. In this way, the input conductor 222A is surrounded by the inner wall 318 of the housing body 218 and the output conductors 222B are surrounded by the peripheral wall 406, inner wall 236A, and outer wall 236B of the output ports 216B of the housing head 220. Thus, the diameter of the inner wall 318 and/or the diameter of the inner wall 236A may be varied to alter impedance of the splitter 202. When assembled, the male end 346 of the center pin 300 is positioned within the interior 502A of the input conductor 222A of the PCB board assembly 212. Accordingly, an electrical path is formed from the female end 350 through the center pin 300 to the male end 346 to the input conductor 222A of the PCB board assembly 212 through the PCB 214 to the output conductors 222B of the PCB board assembly 212.

Figure 7A:
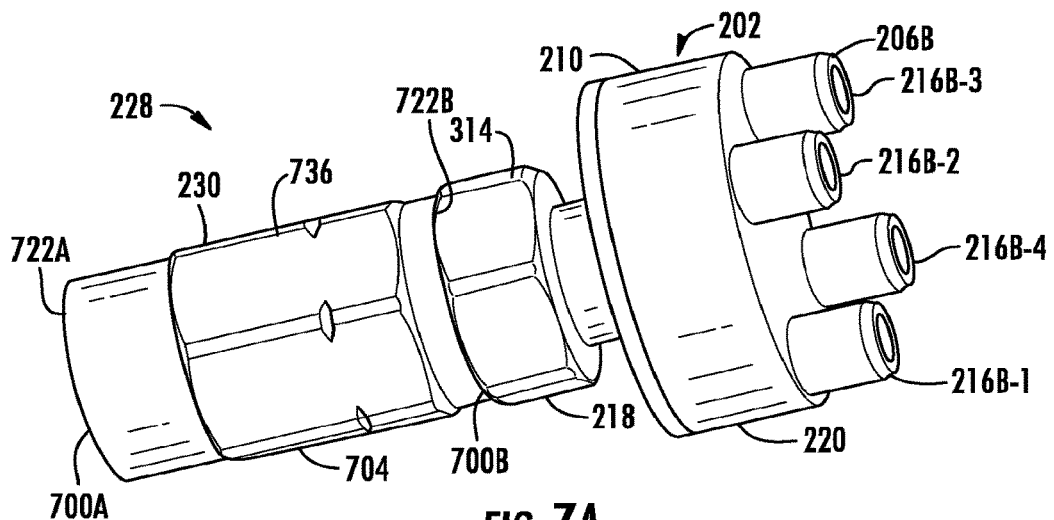
FIG. 7A is a perspective view of a splitter kit assembly including the splitter of FIGS. 2A-2C and a hardline back nut of the hardline cable of FIG. 2A.
Figure 7B:
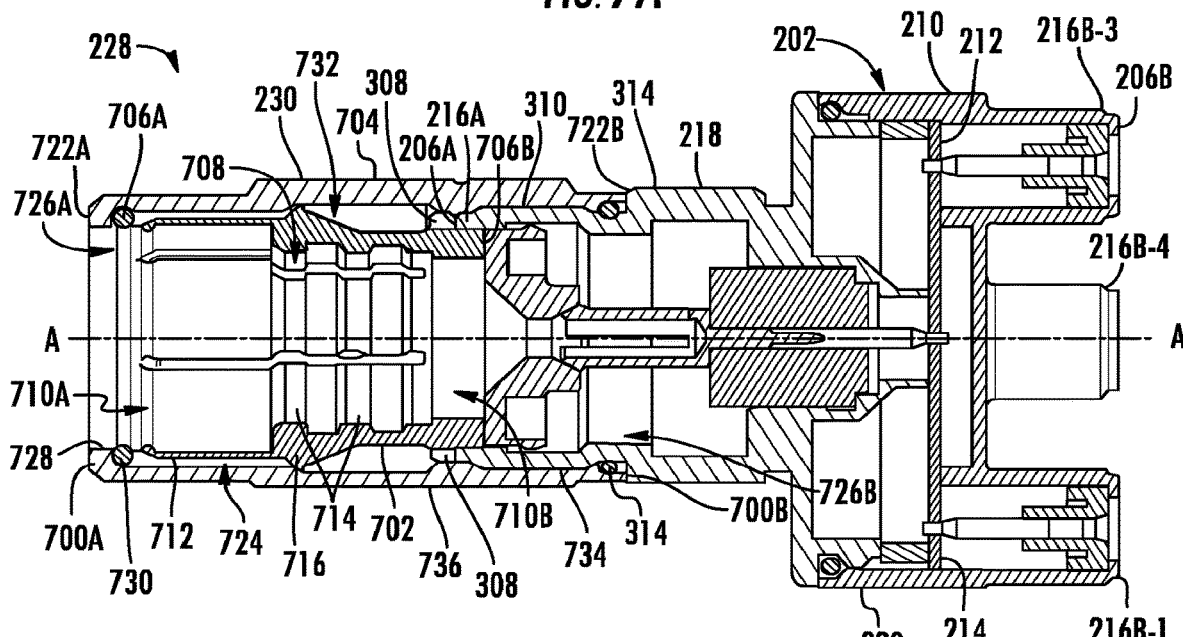
FIG. 7B is a cross-sectional view of the splitter kit assembly of FIG. 7A.
Figure 7C:
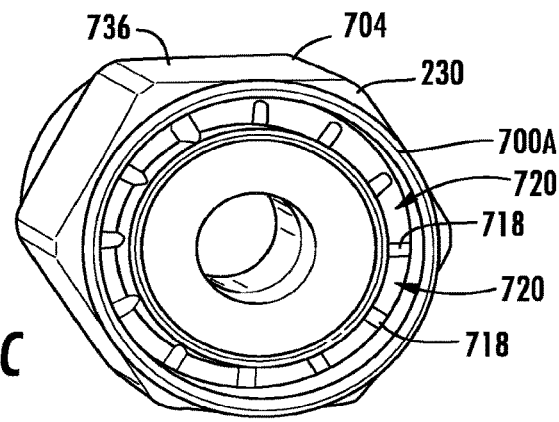
FIG. 7C is a top perspective view of the hardline back nut of the splitter kit assembly of FIG. 7A.

FIGS. 7A-7C are views of a splitter kit assembly 228 which includes the splitter 202 and the hardline back nut 230. As explained in more detail below, the hardline back nut 230 is configured to permanently attach to a hardline cable body 232 and connect the hard line cable body 232 to the splitter 202. See U.S. Pat. No. 9,147,963, the entire disclosure of which is incorporated herein, for a detailed discussion of a hard line back nut 230.

The hardline back nut 230 comprises a first end 700A and a second end 700B opposite the first end 700A. The hardline back nut 230 includes a body 702 and sleeve 704 rotatably positioned around the body 702. The body 702 includes a first end 706A, and a second end 706B opposite the first end 706A. The body 702 also includes an interior 708, a first opening 710A at the first end 706A, and a second opening 710B at the second end 706B. The body 702 includes a compression ring 712 towards the first end 702A and a plurality of internal annular ribs 714 configured to engage at least a portion of the cable body 232 to permanently and non-rotatably affix the hardline back nut 230 to the cable body 232. The compression ring 712 is inwardly biased and is configured to flex outward to press fit the hardline back nut 230 to the cable body 232 and the annular ribs 714, thus facilitating gripping of the body 702 to the cable body 232. The body 702 includes an annular retaining protrusion 716 positioned on an exterior surface of the body 702 to limit axial movement of the sleeve 704 relative to the body 702, explained in more detail below. The body 702 further includes a plurality of circumferentially spaced cogs 718 positioned towards the second end 700B, with a plurality of slots 720 defined between the cogs 718. The cogs 718 and slots 720 (also referred to as an integral hardline locking feature) engage the socking prongs 308 of the body 218 of the sputter housing 210 of the splitter 202 to prevent relative rotation therebetween to facilitate threadable engagement of the sleeve 704 of the hardline back nut 230 with the threaded portion 310 of the body 218 of the splitter housing 210.

The sleeve 704 includes a first end 722A, a second end 722B opposite the first end 722A. The sleeve 704 also includes an interior 724, a first opening 726A at the first end 722A, and a second opening 726B at the second end 722B. The body 702 is positioned within the interior 724 of the sleeve 704, between the first end 722A and the second end 722B. The sleeve 704 includes an inwardly extending flange 728 proximate the first end 700A to receive an o-ring 730 proximate thereto. The o-ring 730 is compressed between the compression ring 712 and the sleeve 704 when engaged with the cable body 232 to provide a seal between the body 702 and the sleeve 704 of the hardline back nut 230. The sleeve 704 further includes an internal recess 732 defined in an internal surface of the sleeve 704 to receive the retaining portion 716 of the body 702 of the hardline back nut 230 to limit axial movement and prevent disengagement of the body 702 from the sleeve 704. The sleeve 704 further includes internal threads 734 positioned towards the second end 700A to threadably engage the threaded portion 310 of the housing body 218. The outer surface of the sleeve 704 includes a hexagonal portion 736 providing a gripping surface for engaging the hardline back nut 230 to the splitter 202.

To engage the splitter 202 with the hardline back nut 230, the hardline back nut 230 and splitter 202 are axially aligned and then axially translated toward each other. The locking prongs 308 of the input port 216A of the housing body 218 of the splitter 202 are inserted into the slots 720 of the body 702 of the hardline back nut 230. Accordingly, the locking prongs 308 and cogs 718 interact with one another to prevent rotation of the splitter 202 relative to the body 702 of the hardline back nut 230. The sleeve 704 is axially moved towards the second end 700B and rotated such that the internal threads 734 of the sleeve 704 of the hardline back nut 230 then threadably engage the threaded portion 310 of the housing body 218. The hexagonal portion 736 of the sleeve 704 of the hardline back nut 230 and the hexagonal portion 315 of the housing body 218 are then used to tighten the connection between the splitter 202 and the hardline back nut 230. The second end 706B of the body 702 contacts the hexagonal portion 315 of the housing body 218 and the first o-ring 314, thus providing a seal between the splitter 202 and the hardline back nut 230. Further, the second end 706B of the body 702 is positioned within the first opening 306A of the housing body 218 and contacts the input port dielectric 334.

It is noted that the housing 210, input port 216A, and plurality of output ports 216B of the splitter 202 include brass, and are integrally formed with each other. In particular, the input port 216A is integrally formed with the housing body 702, and the plurality of output ports 216B are integrally formed with the housing head 220, and all of these components include brass, such as brass with nickel-tin plating. This configuration (and other similar configurations described herein) provide for cost effective manufacturing of a housing 210 with integral ports 216A, 216B. In other words, the housing 210 does not have a monolithic piece with oppositely facing ports 216A, 216B. Further, the hardline back nut 230 also includes brass, such as brass with nickel-tin plating. It is further noted that other materials may be used, and that other materials may be used besides brass, such as materials having a hardness greater than zinc (e.g., a hardness greater than a 2.5 on the Mohs scale of hardness of metals). Thus, the splitter 202 allows for more robust material selection to increase durability and reliability due to increased mechanical strength and resistance to dilatory environmental exposure. Using similar metals (as opposed to the dissimilar metals used in some conventional splitters) between the ports 216A, 216B and the housing 210 has a number of advantages as described above.

Figure 8A:
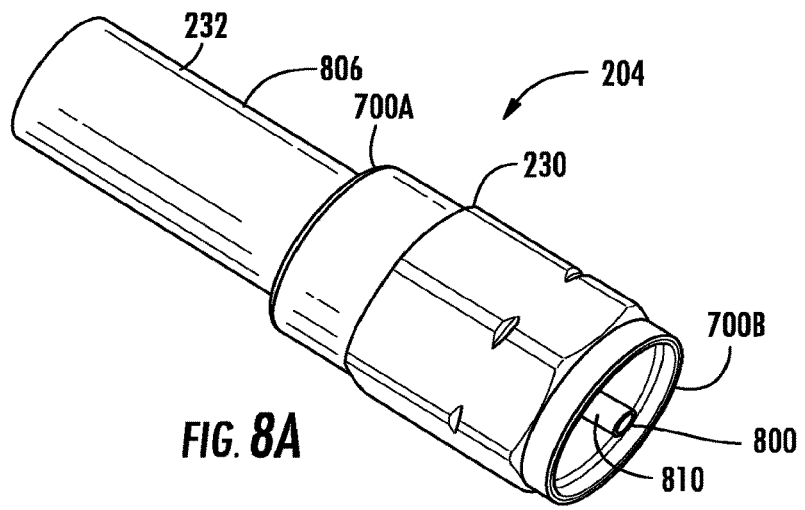
FIG. 8A is a perspective view of the hardline cable of FIG. 2A with the hardline back nut of FIGS. 7A-7C.
Figure 8B:
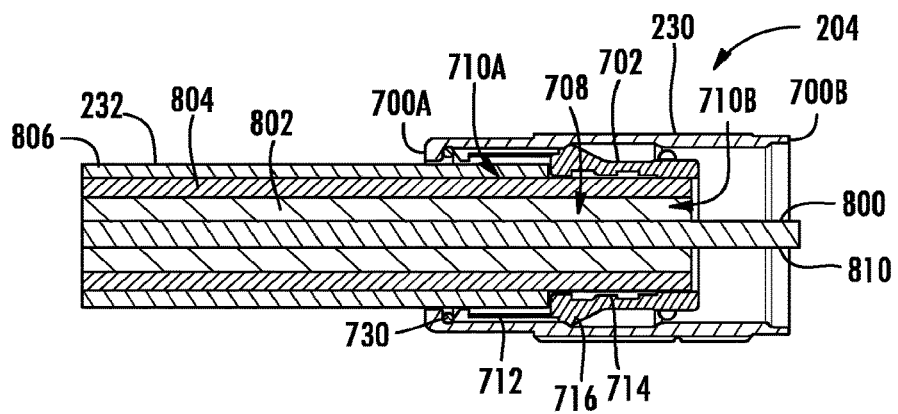
FIG. 8B is a cross-sectional side view of the hardline cable of FIG. 8A.
Figure 8C:
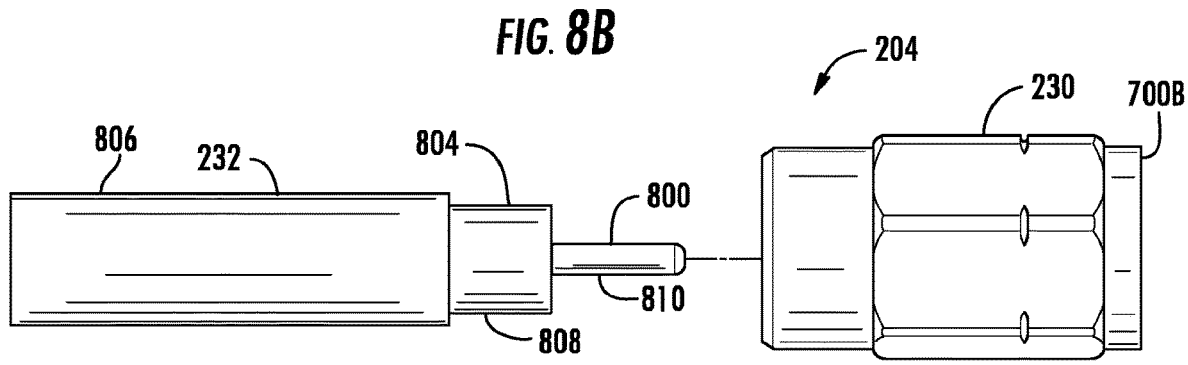
FIG. 8C is an exploded side view of the hardline cable of FIG. 8A.

FIGS. 8A-8C are views of the hardline cable 204 with the hardline back nut 230 assembled to the cable body 232. The cable body 232 includes inner conductor 800 surrounded by insulation material 802, surrounded by outer conductor 804 surrounded by jacket 806. To attach the hardline back nut 230 to the cable body 232, the cable body 232 is first prepped. In particular, the cable body 232 is at least partially stripped to form an exposed portion 808 of the outer conductor 804 and an exposed portion 810 of the inner conductor 800. The cable body 232 is then inserted through the first opening 710A of the back nut body 702 and the first opening 726A of the back nut sleeve 704. Accordingly, the compression ring 712 of the back nut body 702 frictionally engages the jacket 806 of the cable body 232, and the annular ribs 714 of the back nut body 702 frictionally engage the outer conductor 804 of the cable body 232. The exposed portion 810 of the inner conductor 800 extends past the second end 806B of the back nut body 702 (i.e., through the second opening 710B of the back nut body 702. At least a portion of the exposed portion 810 of the inner conductor 800 extends proximate to or past the second end 722B (i.e., through the second opening 726B) of the sleeve 704.

Figure 9A:
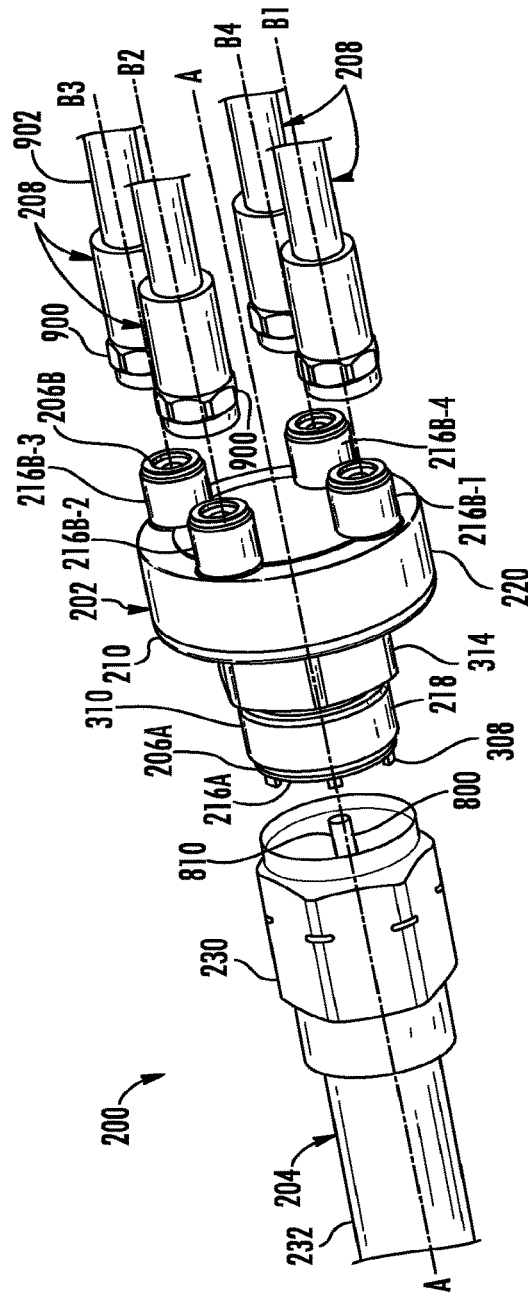
FIG. 9A IS a perspective view of the connector system of FIG. 2A when unassembled.
Figure 9B:
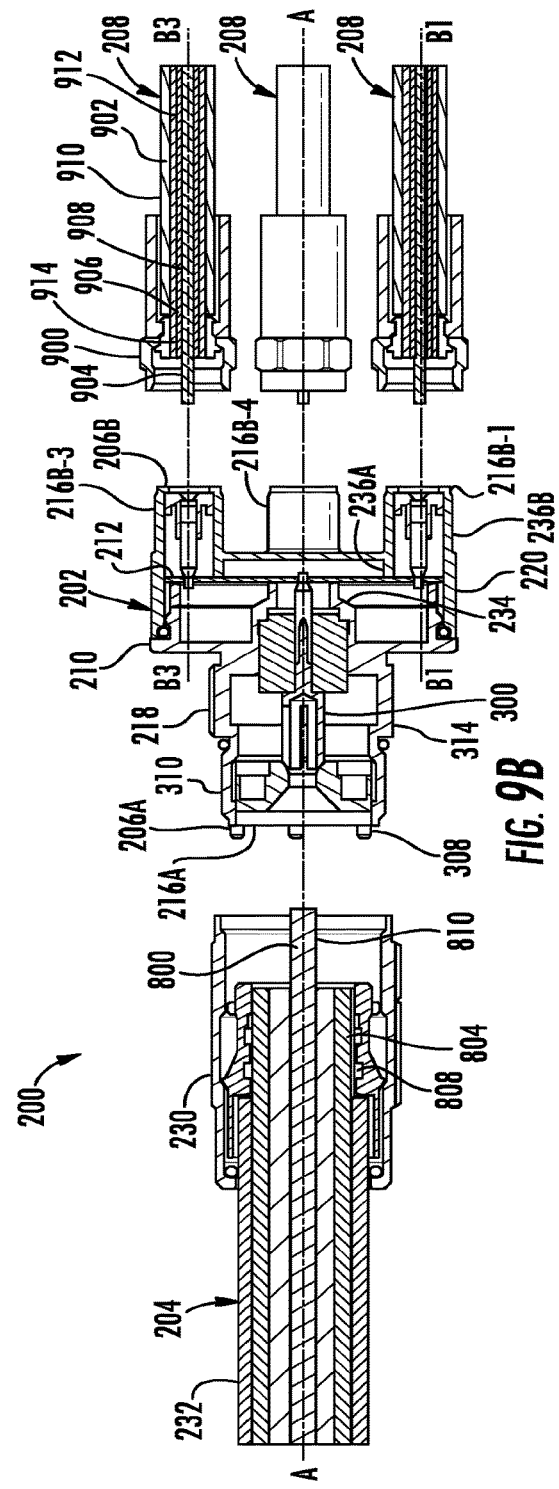
FIG. 9B is a cross-sectional exploded side view of the connector system of FIG. 9A.

FIGS. 9A-9D are views of the connector system 200 when unassembled and when assembled. Referring to FIGS. 9A-9B, shown are views of the connector system 200 of FIG. 2A when unassembled. To assemble, the hardline cable 204 is aligned with the input port 216A of the splitter 202 along axis A-A, and the output cables 208 are aligned with the output ports 216B-1 to 216B-4 of the splitter 202 along axes B-B. Output cables 208 include connector 900 and cable body 902, where the cable body 902 includes inner conductor 904 surrounded by insulation material 906, surrounded by outer conductor 908 surrounded by jacket 910. The cable body 902 includes an exposed portion 912 of the outer conductor 908 and an exposed portion 914 of the inner conductor 904.

Figure 9C:
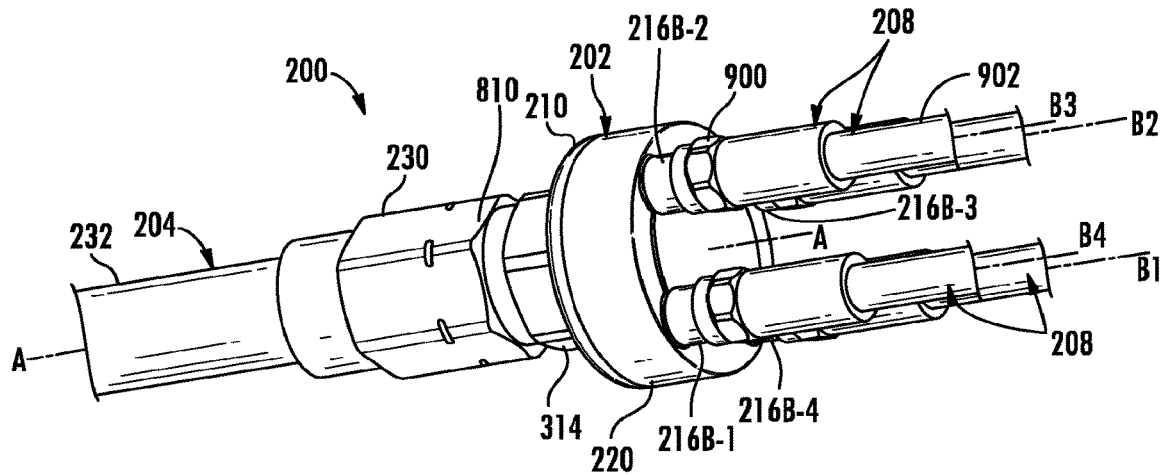
FIG. 9C IS a perspective view of the connector system of FIG. 9A when assembled.
Figure 9D:
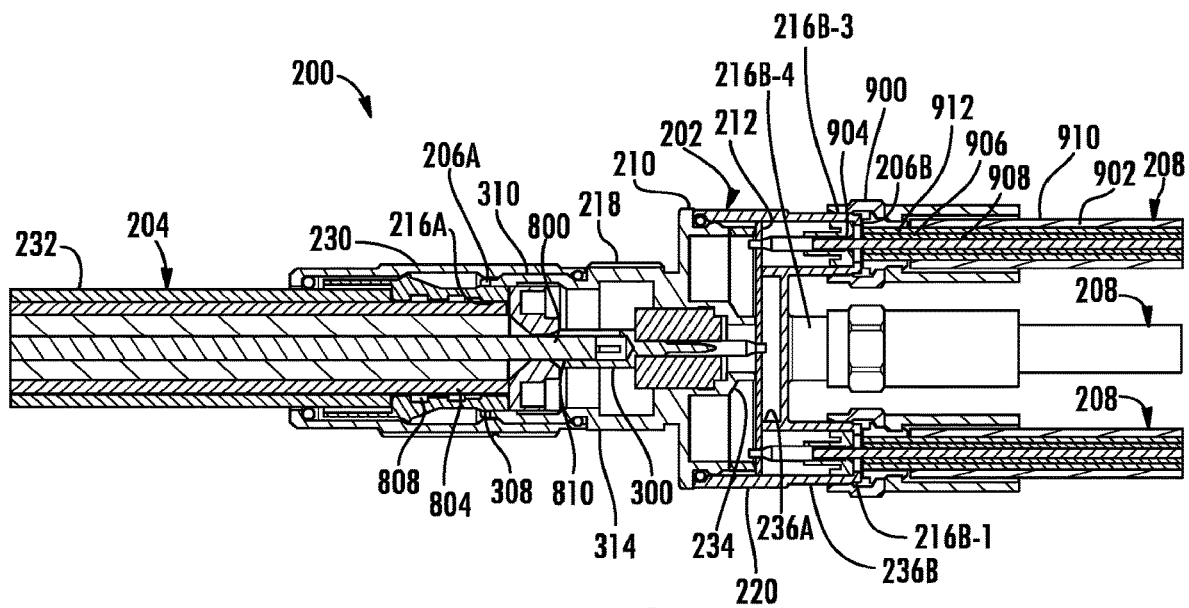
FIG. 9D is a cross-sectional exploded side view of the connector system of FIG. 9A.

Referring to FIGS. 9C-9D, shown are views of the connector system 200 when assembled. As similarly described with respect to FIGS. 7A-7C above, to engage the splitter 202 with the hardline back nut 230, the hardline back nut 230 and splitter 202 are axially aligned and then axially translated toward each other. The locking prongs 308 of the input port 216A of the housing body 218 of the splitter 202 are inserted into the slots 720 of the body 702 of the hardline back nut 230. The sleeve 704 is axially translated towards the second end 700B and rotated such that the internal threads 734 of the sleeve 704 of the hardline back nut 230 then threadably engages the threaded portion 310 of the housing body 218. Exposed portion 810 of the cable body 232 is inserted into the input conductor 222A of the splitter 202. Similarly, output cables 208 are axially translated towards the output ports 216E of the splitter 202. Where the exposed portion 810 of the inner conductor 800 is inserted into the output conductor 222B, and the connector 900 of the output cable 208 engages at least a portion of the output port 216E of the splitter 202.

When assembled, an electrical path is formed from the inner conductor 800 of the cable body 232 of the hardline cable 204 to the input conductor 222A of the PCB board assembly 212 through the PCB 214 to the output conductors 222B of the PCB board assembly 212 to the inner conductors 904 of the output cables 208. Further, a grounding path is formed from the outer conductor 908 of the cable body 232 of the hardline cable 204 to the back nut body 702 of the hardline back nut 230 to the input port 216A of the housing body 218 of the sputter 202 to the housing head 220 of the sputter 202 to the connector 900 of the output cable 208 to the outer conductor 908 of the cable body 902 of the output cable 208.

FIGS. 10A-14 are views of additional embodiments of the connector system 200, sputter kit assembly 228, and/or splitter 202, which include many of the same or similar features of the sputter 202 discussed above with respect to FIGS. 2A-9D. Whenever possible, the same reference numerals will be used throughout the drawings to refer to the same or like parts.

Figure 10A:
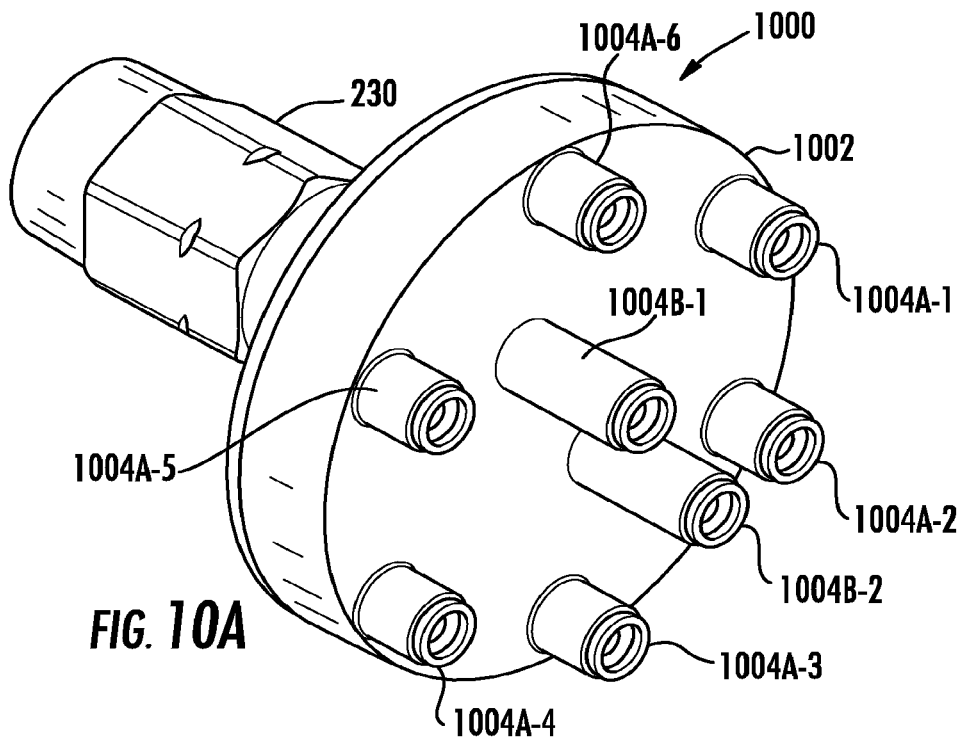
FIG. 10A is a perspective view of another embodiment of the splitter kit assembly of FIGS. 7A-7C including a splitter head with eight output ports.
Figure 10B:
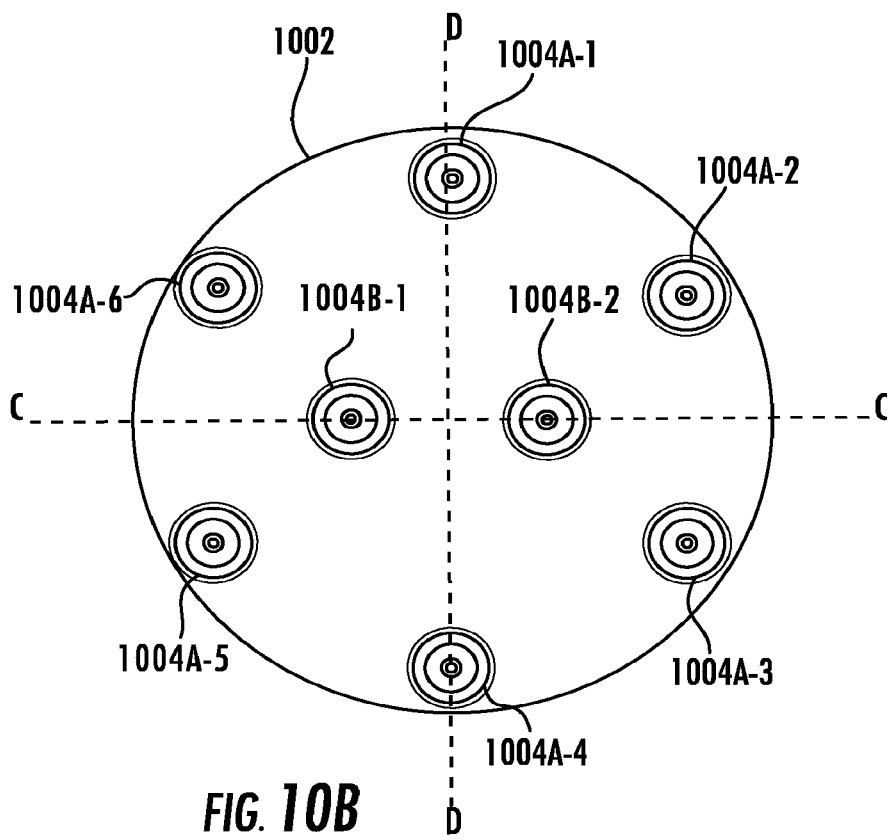
FIG. 10B is a top view of the housing head of the splitter kit assembly of FIG. 10A.

FIGS. 10A-10B are views of another embodiment of the splitter kit assembly 1000 of FIGS. 7A-7C including a splitter head 1002 with eight output ports 1004. The output ports 1004 include six outer output ports 1004A-I to 1004A-6 (collectively referred to as outer output ports 1004A) and two inner output ports 1004B-I, 1004B-2 (collectively referred to as inner output ports 1004B). The splitter head 1002 defines a first axis C-C and a second axis D-D perpendicular to the first axis C-C. The outer ports 1004A are circumferentially positioned around a periphery of the splitter head 1002, with output port 1004A-I being offset, as discussed above. The housing head 220 has as small a diameter as possible (e.g., 72.6 mm), while maintaining each outer output port 1004A spaced at least about 22 mm apart (e.g., within 5% difference) from each adjacent outer output port 1004A. This 22 mm distance ensures enough spacing for the connectors 900 of the output cables 208 (see FIGS. 9A-9D). Accordingly, outer output ports 1004A-1, 1004A-4 are positioned along second axis D-D. Inner output ports 1004B-I, 1004B-2 are positioned along first axis C-C and are at least about 22 mm apart (e.g., within 5% difference) from one another. Further, inner output port 1004B-I is at least about 22 mm apart (e.g., within 5% difference) from outer output ports 1004A-5, 1004A-6, and inner output port 1004B-2 is at least about 22 mm (e.g., 22.17 mm) apart from outer output ports 1004A-2, 1004A-3 (e.g., within 5% difference). Further, each outer output port 1004A is spaced at least 22 mm (e.g., 30.51 mm) from each other adjacent outer output port 1004A. Inner output ports 1404E are taller than outer output ports 1004A to provide sufficient clearance for an operator to connect the output cables 208 to the inner output ports 10048. For example, the outer output ports 1004A may each have a height of 0.5 mm, and the inner output ports 1004B may each have a height of 19 millimeters. It is noted that in other embodiments, the inner output ports 10048 may be omitted, such as to provide a six port splitter.

Figure 11:
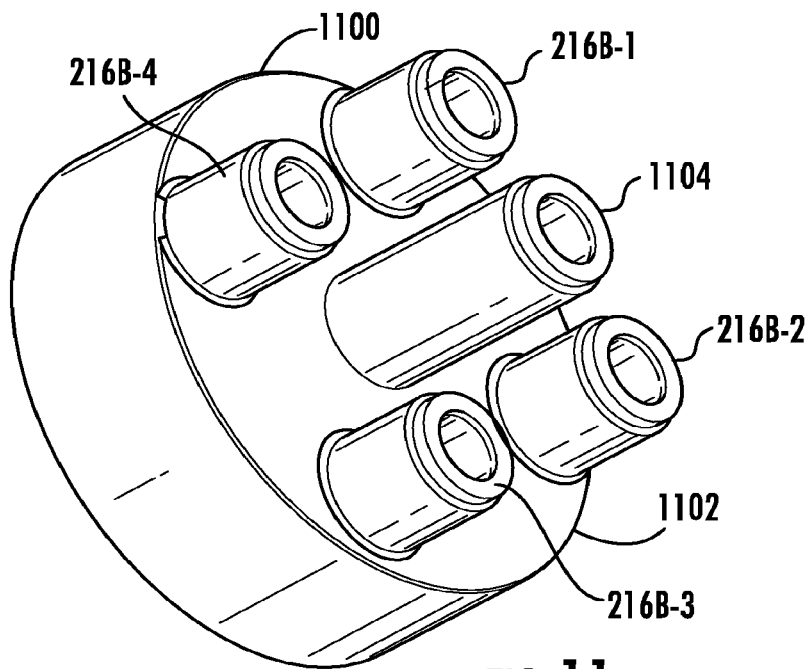
FIG. 11 is a perspective view of another embodiment of the splitter of FIGS. 2A-2C including a housing head with one input port and four output ports positioned in a top wall of the housing head.

FIG. 11 is a perspective view of another embodiment of the splitter of FIGS. 2A-2C including a splitter 1100 with a splitter head 1102 with one input port 1104 and four output ports 216B positioned in an upper wall 408 of the splitter head 1102. The splitter head 1102 includes an input port 1104 in the center of the upper wall 408 of the splitter head 1102. The input port 1104 is configured for connection to a coaxial cable, although the input port 1104 could also be configured for connection to a hardline cable 204, as discussed above (see FIGS. 9A-9D). Further, the input port 1104 is taller than the output ports 216B to provide sufficient clearance for an operator to connector an input cable to the input port 1104. Although not shown, the splitter 1100 may include a plate to screw into a back surface of the splitter 1100.

Figure 12:
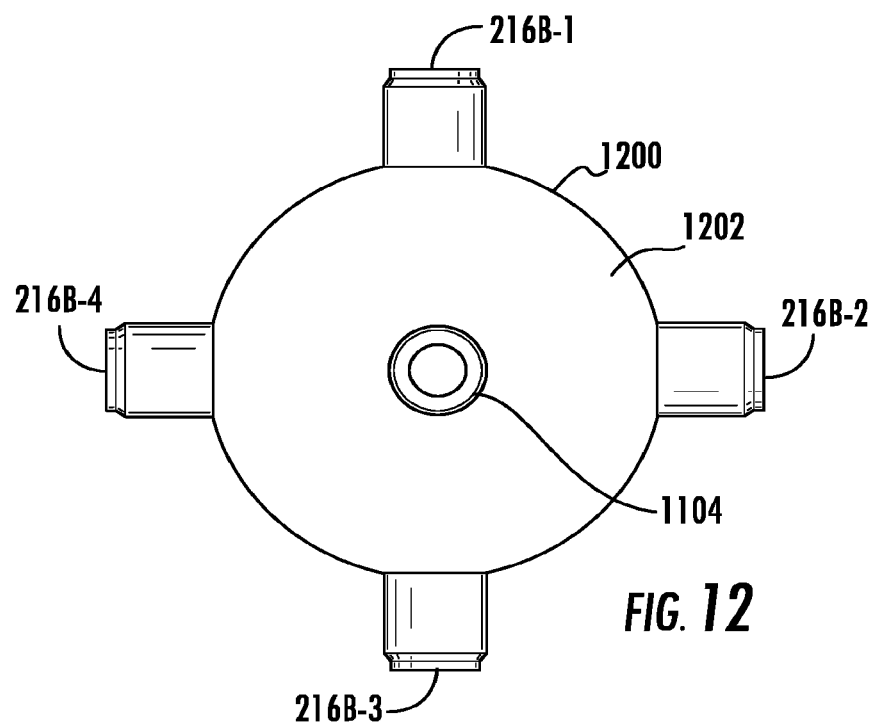
FIG. 12 is a top view of another embodiment of the splitter of FIGS. 2A-2C including a housing head with one input port positioned in a top surface of the splitter head and four output ports positioned in a peripheral wall of the housing head.

FIG. 12 is a top view of another embodiment of the splitter of FIGS. 2A-2C including splitter 1200 with a splitter head 1202 with one input port 1104 positioned in a top surface of the splitter head 1202 and four output ports 2168 positioned in a peripheral wall 406 of the splitter head 1202. In particular the output ports 2168 are circumferentially and evenly spaced around the peripheral wall 406. Although not shown, the splitter 1100 may include a plate to screw into a back surface of the splitter 1100. Further, the ports 2168-1 to 2168-4 are non-integrally formed with the splitter head 1202, such as by press fit or using one or more fasteners, etc. Although in other embodiments, the ports 2168-1 to 2168-4 may be integrally formed, such as by die casting.

Figure 13:
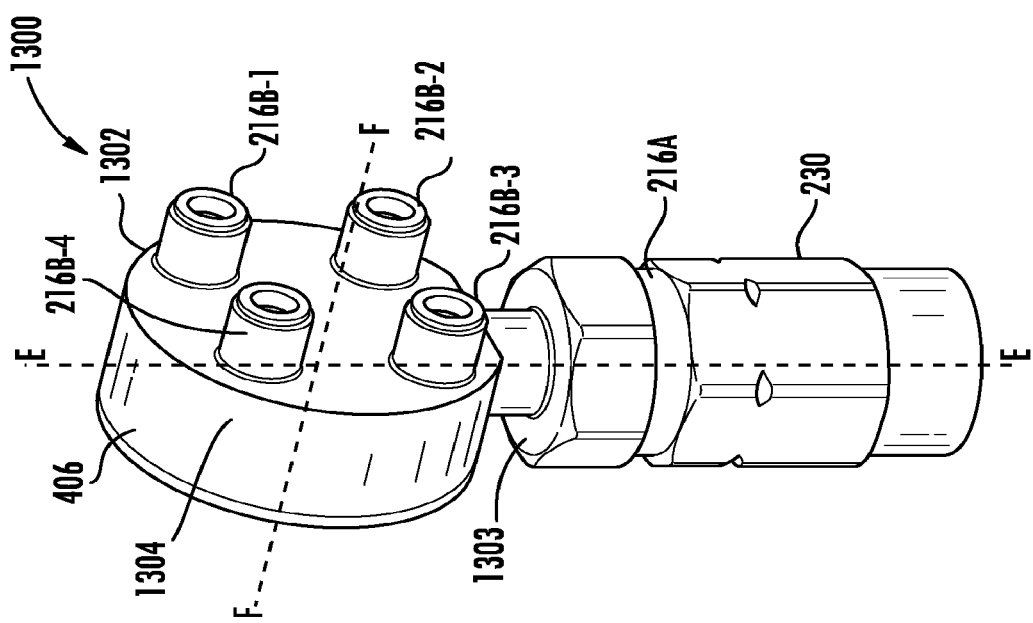
FIG. 13 is a perspective view of another embodiment of the splitter kit assembly of FIGS. 7A-7C including a splitter with the input port perpendicular to the output ports.

FIG. 13 is a perspective view of another embodiment of the splitter kit assembly 1300 of FIGS. 7A-7C including a splitter 1302 with the input port 216A perpendicular to the output ports 2168-1 to 2168-4. In particular, the housing body 1303 is attached to the housing head 1304 at the peripheral wall 406 of the head 1304. However, the input conductor 222A may still be attached to the PCB 214 at a center of the PCB 214 so that the input contact point 226A is approximately equidistant from the output contact points 2268-1 to 2268-4 for the output conductors 2228 (not shown). Accordingly, an axis E-E defined by the housing body 1303 is generally perpendicular to the axis F-F defined by the housing head 1304.

Figure 14:
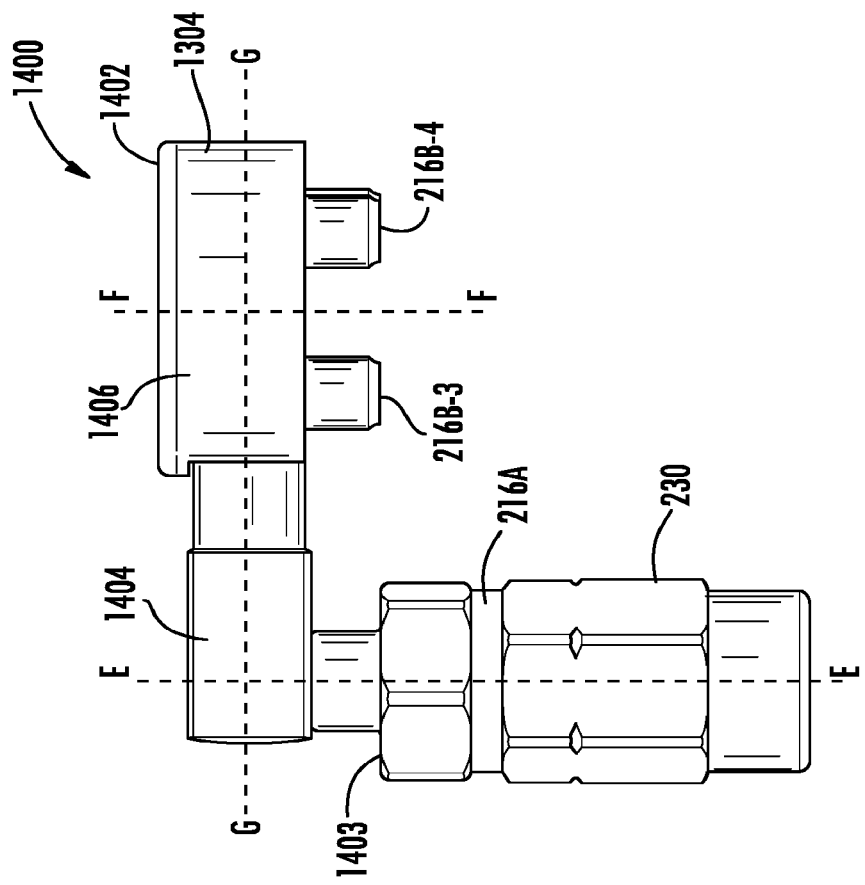
FIG. 14 is a perspective view of another embodiment of the splitter kit assembly of FIGS. 7A-7C including a splitter with the input port facing the same direction as the output ports.

FIG. 14 is a perspective view of another embodiment of the splitter kit assembly 1400 of FIGS. 7A-7C including a splitter 1402 with the input port 216A facing the same direction as the output ports 2168-1 to 2168-4. In particular, the housing body 1403 is attached to the head 1404 at the peripheral wall 406 of the head 1402 by a neck 1406, where the neck 1406 is generally perpendicular to the housing body 1403 and also generally perpendicular to the housing head 220. Accordingly, an axis E-E defined by the housing body 218 is generally perpendicular to the axis G-G defined by the neck 1406, the axis E-E is generally perpendicular to the axis G-G defined by the housing head 1404, and axis E-E and F-F are generally parallel to one another. In this way, the input port 216A and output ports 2168-1 to 2168-4 are facing the same direction.

Figure 15B:
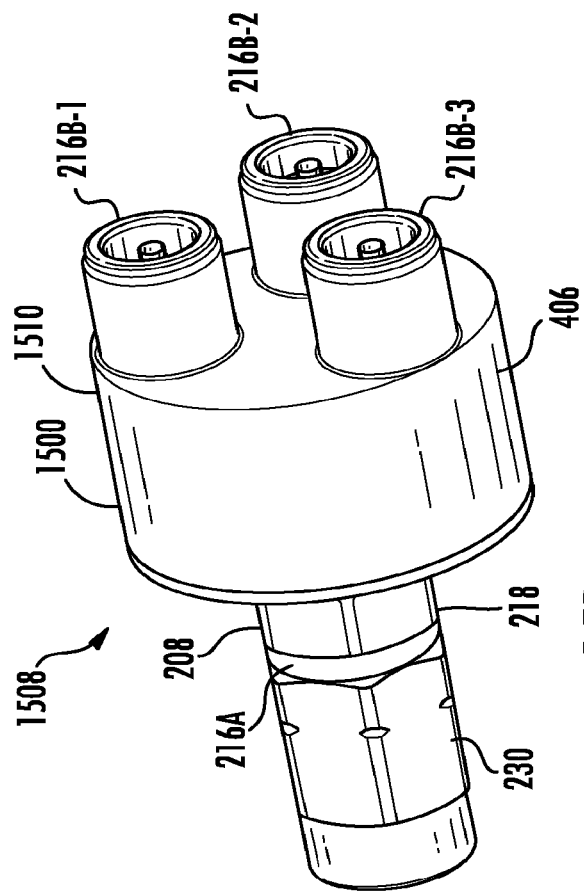
FIG. 15B is a perspective view of a power splitter kit assembly including the power splitter of FIG. 15A.
Figure 15A:
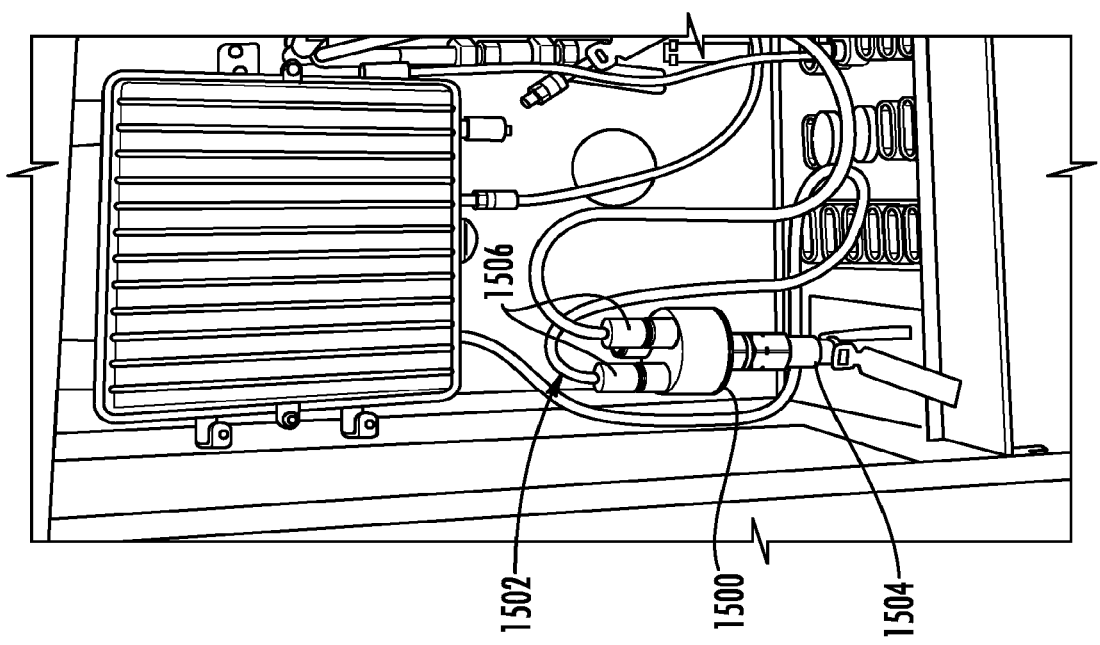
FIG. 15A is a perspective view of another embodiment of a connector system illustrating an exemplary power splitter including similar features as the splitters of FIGS. 2A-14.

FIGS. 15A-158 are views of a connector system with an exemplary power splitter 1500. In particular, FIG. 15A is a perspective view of another embodiment of a connector system 1502 illustrating an exemplary power splitter 1500. Power splitter includes many of the same or similar features of the splitter 202 discussed above with respect to FIGS. 2A-14. The connector system 1502 includes an input power cable 1504 and a plurality of output power cables 1506. FIG. 15B is a perspective view of a power splitter kit assembly 1508 including the power splitter of FIG. 15A. As shown, the splitter 1500 of the power splitter kit assembly 1508 includes a body 218 and head 1510. The body 218 includes an input port 216A and the head 1510 includes three output ports 216E circumferentially positioned around a peripheral wall 406 of the power splitter 1500. Splitter 1500 is pre-configured for optimum performance, such that an operator or installer does not, and even cannot, change electronic performance of the splitter 1500, such as through human error. It is noted that the power splitter 1500 only has a 90-degree turn of a signal at any point. Further, the power splitter 1500 does not require any additional adapter to connect to the power splitter to an input cable.

It will be apparent to those skilled in the art that various modifications and variations can be made without departing from the spirit or scope of the invention. Since modifications combinations, sub-combinations and variations of the disclosed embodiments incorporating the split and substance of the invention may occur to persons skilled in the art, the invention should be construed to include everything within the scope of the appended claims and their equivalents.

What is claimed is:

1. A splitter for allowing a hardline cable to be connected to the splitter as an input and a coaxial connector to be connected to the splitter as an output comprising:
a housing;
a hardline back nut;
wherein the housing includes an input port;
wherein the input port is configured to receive an input cable;
wherein the input cable is a hardline input cable;
wherein the housing includes an output port;
wherein the output port is configured to mechanically and electrically engage an output cable;
wherein the output cable is a coaxial cable;
wherein the input port includes an engagement portion configured to engage the hardline back nut;
wherein the engagement portion is a threaded portion;
wherein the hardline back nut includes a cog;
wherein the housing includes a locking prong configured to extend adjacent the cog;
wherein the extension of the locking prong adjacent the cog is configured to limit rotation of the hardline back nut relative to the housing;
wherein the splitter is configured to receive a center conductor of the hardline input cable;
wherein the splitter is configured to be connected to the hardline input cable without requiring additional hardware to connect the splitter to the hardline input cable, wherein the hardline back nut includes a plurality of the cog, and the housing includes a plurality of the locking prong, and wherein the locking prongs are configured to extend between the cogs.

2. The splitter of claim 1, wherein the output port comprises a plurality of the output port.

3. The sputter of claim 1, wherein the output port comprises at least three of the output port.

4. The sputter of claim 1, wherein the extension of the locking prongs between the cogs is configured to limit rotation of the hardline back nut relative to the housing.

5. A splitter for allowing a hardline cable to be connected to the splitter as an input and a plurality of connectors to be connected to the splitter as outputs comprising: a housing; a hardline back nut; wherein the housing includes an input port; wherein the input port is configured to receive a hardline input cable; wherein the housing includes an output port; wherein the output port is configured to receive a coaxial cable; wherein the input port includes an engagement portion configured to engage the hardline back nut; wherein the engagement portion is a threaded portion; wherein the splitter is configured to connect directly to the hardline input cable; and wherein the direct connection of the splitter to the hardline cable is configured to permit installation of the splitter on the hardline input cable without additional hardware to connect the splitter to the hardline input cable, wherein the hardline back nut includes a plurality of cogs, and the housing includes a plurality of locking prongs configured to extend between the cops.

6. The splitter of claim 5, wherein the output port is configured to mechanically and electrically engage an output cable.

7. The sputter of claim 5, further comprising a printed circuit board assembly positioned in the housing.

8. The splitter of claim 7, wherein the printed circuit board assembly includes an input contact and a plurality of output contacts.

9. The splitter of claim 5, wherein the extension of the locking prongs between the cogs is configured to limit rotation of the hardline back nut relative to the housing.

10. The splitter of claim 5, wherein the splitter is configured to receive a center conductor of the hardline cable.

11. The splitter of claim 5, wherein the output port comprises a plurality of output ports.

12. A splitter for allowing a hardline cable to be connected to the splitter as an input and a connector to be connected to the splitter as an output comprising: a housing portion; wherein the housing portion includes an input portion; wherein the input portion is configured to receive a hardline input cable; wherein the housing portion includes an output portion; wherein the input portion includes an engagement portion configured to engage a hardline back nut; wherein the splitter is configured to connect to the hardline input cable; and wherein the connection of the splitter to the hardline input cable is configured to allow the splitter to be installed on the hardline input cable without additional hardware to connect the splitter to the hardline input cable, wherein the hardline back nut includes a plurality of cogs; and wherein the housing includes a plurality of locking prongs configured to extend between the plurality of coos of the hardline back nut.

13. The splitter of claim 12, wherein the output portion is configured to receive an output cable.

14. The splitter of claim 13, wherein the output cable comprises a coaxial cable.

15. The splitter of claim 14, wherein the engagement portion comprises a threaded portion.

16. The splitter of claim 14, wherein the output portion is configured to mechanically and electrically engage the output cable.

17. The splitter of claim 14, further comprising a printed circuit board assembly positioned in the housing portion.

18. The splitter of claim 17, wherein the printed circuit board assembly includes an input contact and a plurality of output contacts.

19. The splitter of claim 12, wherein the extension of the locking prongs between the cogs is configured to limit rotation of the hardline back nut relative to the housing portion.

20. The splitter of claim 14, wherein the splitter configured to receive a center conductor of the hardline input cable.

21. The sputter of claim 14, wherein splitter is configured to connect directly to the hardline input cable.

22. The splitter of claim 14, wherein the output portion comprises a plurality of output ports.

23. The sputter of claim 22, wherein the plurality of output ports comprises at least three output ports.

* * * * *